(12) United States Patent
Yu et al.

(10) Patent No.: US 11,133,282 B2
(45) Date of Patent: Sep. 28, 2021

(54) COWOS STRUCTURES AND METHODS FORMING SAME

(71) Applicant: Taiwan Semiconductor Manufacturing Company, Ltd., Hsinchu (TW)

(72) Inventors: Chen-Hua Yu, Hsinchu (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/427,477

(22) Filed: May 31, 2019

(65) Prior Publication Data
US 2020/0381391 A1    Dec. 3, 2020

(51) Int. Cl.
| | |
|---|---|
| H01L 23/00 | (2006.01) |
| H01L 23/522 | (2006.01) |
| H01L 23/498 | (2006.01) |
| H01L 25/065 | (2006.01) |
| H01L 23/31 | (2006.01) |

(Continued)

(52) U.S. Cl.
CPC ............ *H01L 24/97* (2013.01); *H01L 21/561* (2013.01); *H01L 21/6835* (2013.01); *H01L 23/295* (2013.01); *H01L 23/3121* (2013.01); *H01L 23/3135* (2013.01); *H01L 23/481* (2013.01); *H01L 23/4824* (2013.01); *H01L 23/49827* (2013.01); *H01L 23/5226* (2013.01); *H01L 23/5384* (2013.01); *H01L 23/5389* (2013.01); *H01L 24/16* (2013.01); *H01L 24/18* (2013.01); *H01L 24/81* (2013.01); *H01L 25/0655* (2013.01); *H01L 25/18* (2013.01); *H01L 25/50* (2013.01); *H01L 21/563* (2013.01);

(Continued)

(58) Field of Classification Search
CPC ......... H01L 24/97; H01L 24/16; H01L 25/50; H01L 23/5226; H01L 25/0655; H01L 25/18; H01L 24/81; H01L 23/3135; H01L 23/49827; H01L 21/561
See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |

(Continued)

FOREIGN PATENT DOCUMENTS

| | | |
|---|---|---|
| KR | 20150094135 A | 8/2015 |
| KR | 20160111308 A | 9/2016 |

(Continued)

*Primary Examiner* — Ahmed N Sefer
(74) *Attorney, Agent, or Firm* — Slater Matsil, LLP

(57) ABSTRACT

A method includes bonding a device die to an interposer. The interposer includes a through-via extending from a top surface of a semiconductor substrate of the interposer into an intermediate level between the top surface and a bottom surface of the semiconductor substrate. A singulation process is performed to saw the interposer and the device die into a package. The method further includes placing the package over a carrier, encapsulating the package in an encapsulant, thinning the encapsulant and the semiconductor substrate of the interposer until the through-via is exposed, and forming redistribution lines, wherein a redistribution line in the redistribution lines is in contact with the through-via.

19 Claims, 26 Drawing Sheets

(51) Int. Cl.
  *H01L 21/56* (2006.01)
  *H01L 25/18* (2006.01)
  *H01L 25/00* (2006.01)
  *H01L 23/29* (2006.01)
  *H01L 23/538* (2006.01)
  *H01L 23/482* (2006.01)
  *H01L 23/48* (2006.01)
  *H01L 21/683* (2006.01)
  *H01L 23/14* (2006.01)

(52) U.S. Cl.
  CPC .......... *H01L 21/568* (2013.01); *H01L 23/145* (2013.01); *H01L 23/3128* (2013.01); *H01L 23/49816* (2013.01)

(56) References Cited

U.S. PATENT DOCUMENTS

| | | | |
|---|---|---|---|
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 9,252,030 | B1 * | 2/2016 | Jin ........................ H01L 21/568 |
| 10,090,234 | B2 | 10/2018 | Kelly et al. |
| 10,141,276 | B2 | 11/2018 | Hsu et al. |
| 2011/0291288 | A1 | 12/2011 | Wu et al. |
| 2012/0074585 | A1 * | 3/2012 | Koo ...................... H01L 21/486 |
| | | | 257/774 |
| 2012/0088332 | A1 * | 4/2012 | Lee ........................ H01L 21/561 |
| | | | 438/113 |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0105213 | A1 | 5/2013 | Hu et al. |
| 2013/0168848 | A1 | 7/2013 | Lin et al. |
| 2013/0307140 | A1 | 11/2013 | Huang et al. |
| 2014/0038353 | A1 * | 2/2014 | Kim ........................ H01L 21/50 |
| | | | 438/107 |
| 2014/0203429 | A1 | 7/2014 | Yu et al. |
| 2014/0225222 | A1 | 8/2014 | Yu et al. |
| 2014/0225277 | A1 | 8/2014 | Chang et al. |
| 2014/0252646 | A1 | 9/2014 | Hung et al. |
| 2014/0264930 | A1 | 9/2014 | Yu et al. |
| 2015/0235935 | A1 * | 8/2015 | Lin ................... H01L 23/49827 |
| | | | 257/693 |
| 2015/0318261 | A1 | 11/2015 | Chung et al. |
| 2015/0348940 | A1 * | 12/2015 | Woychik ............. H01L 25/0657 |
| | | | 257/774 |
| 2016/0148903 | A1 * | 5/2016 | Su ........................... H01L 24/94 |
| | | | 257/737 |
| 2017/0263518 | A1 * | 9/2017 | Yu ........................... H01L 25/00 |
| 2018/0068978 | A1 * | 3/2018 | Jeng ........................ H01L 24/92 |
| 2018/0102311 | A1 | 4/2018 | Shih |
| 2018/0138151 | A1 * | 5/2018 | Shih ........................ H01L 25/117 |
| 2019/0164860 | A1 | 5/2019 | Lin et al. |

FOREIGN PATENT DOCUMENTS

| | | |
|---|---|---|
| KR | 101799326 B1 | 11/2017 |
| TW | 201816901 A | 5/2018 |
| TW | 201826462 A | 7/2018 |

* cited by examiner

COWOS STRUCTURES AND METHODS FORMING SAME

BACKGROUND

In the packaging of integrated circuits, a plurality of dies may be bonded on an interposer wafer, which comprises a plurality of interposers therein. After the bonding of the dies, an underfill may be dispensed into the gaps between the dies and the interposer wafer. A curing process may then be performed to cure the underfill.

Underfill may shrink after being cured. As a result, the cured underfill applies a stress on the dies and the interposer wafer, and may cause the interposer wafer to have a warpage. The warpage of the interposer wafer further results in the process difficulty in the subsequent processes. For example, in a subsequent process (e.g. molding, grinding, thinning, or the like), the interposer wafer needs to be secured on a chuck table through vacuum in order to form metal lines and solder regions thereon. With the interposer wafer having the warpage, however, the interposer wafer may not be able to be secured on the chuck table.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
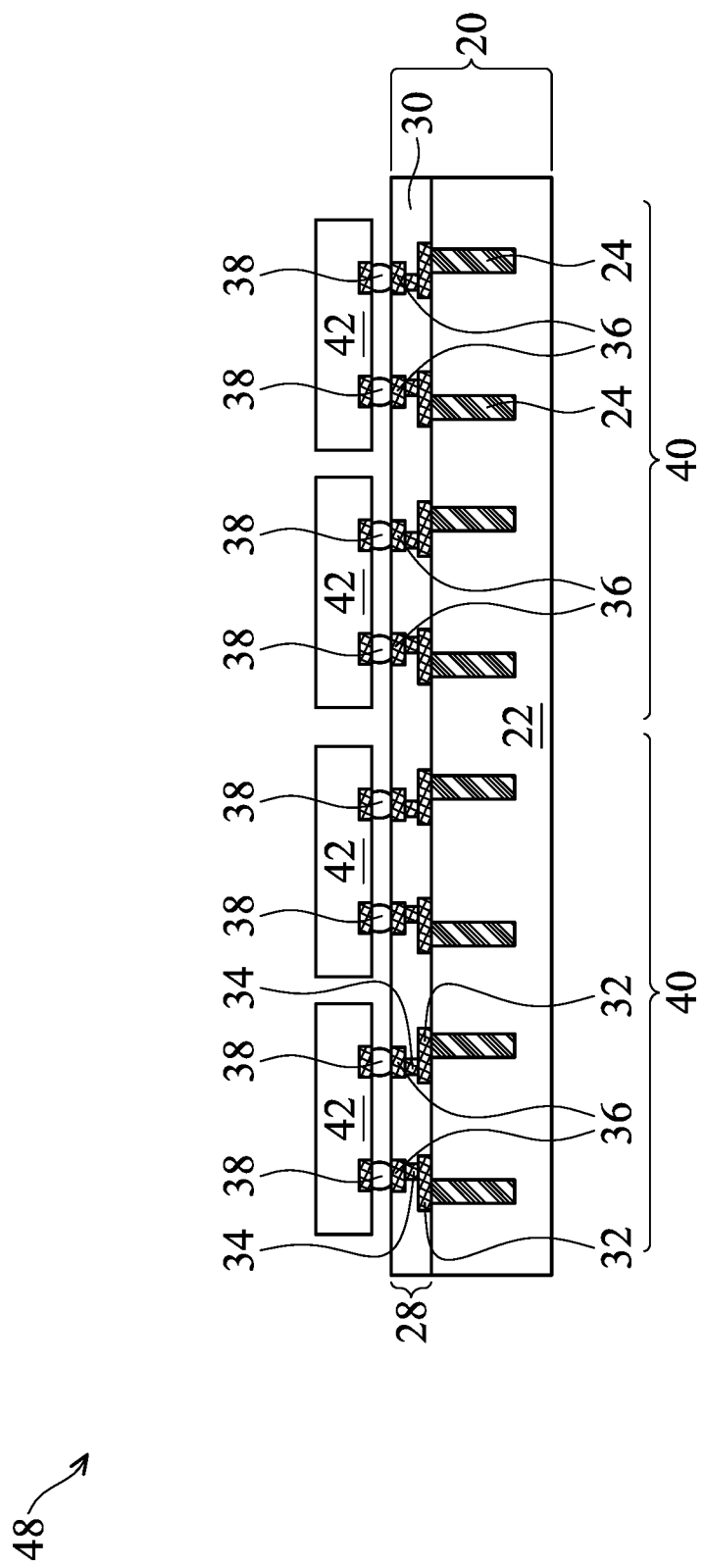
FIGS. 1 through 18 are cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various embodiments. The intermediate stages in the formation of the package are illustrated in accordance with some embodiments. Some variations of some embodiments are discussed. Throughout the various views and illustrative embodiments, like reference numbers are used to designate like elements. In accordance with some embodiments of the present disclosure, a process for forming a Chip-on-Wafer-on-Substrate (CoWoS) package includes bonding device dies on an interposer wafer, encapsulating the device dies, and then sawing the resulting reconstructed wafer into discrete Chip-on-Wafer (CoW) packages. The discrete CoW packages are then placed over a carrier and then encapsulated. A thinning/planarization process is performed to reveal the through-vias in the interposer. Redistribution lines (RDLs) are formed using fan-out processes, with the RDLs and the corresponding dielectric layers in combination acting as a substrate. Accordingly, the substrate of the present disclosure is formed starting from the interposers, rather than being pre-formed and bonded to the CoW packages.

Embodiments will be described with respect to a specific context, namely a CoWoS package. Other embodiments may also be applied, however, to other packages such as the bonding of device dies to device wafers (rather than interposer wafers) including active devices such as transistors, and other processing. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

Figure 26:
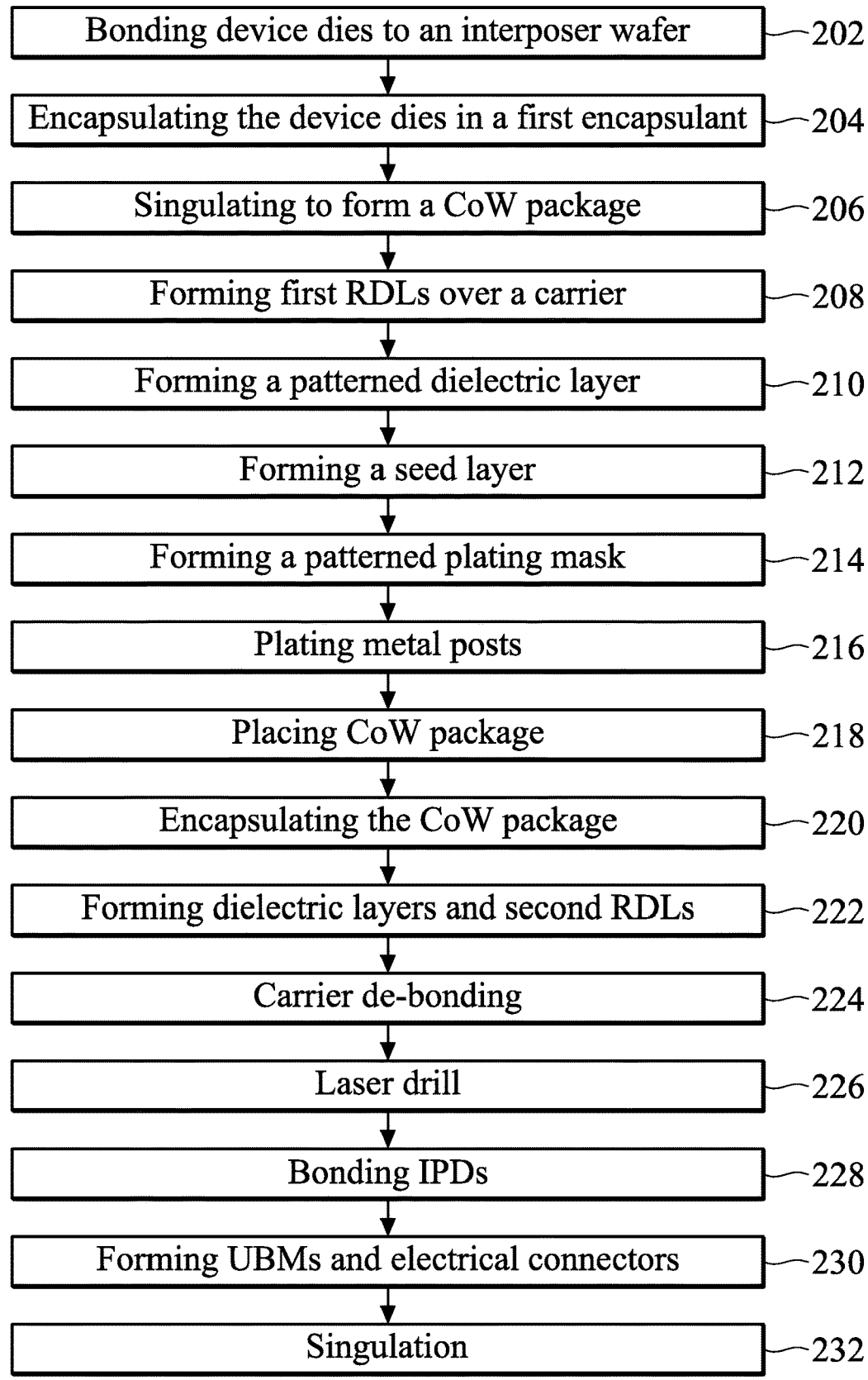
FIG. 26 illustrates a process flow for forming a package in accordance with some embodiments.

FIGS. 1 through 18 illustrate the cross-sectional views of intermediate stages in the formation of a package in accordance with some embodiments of the present disclosure. The corresponding processes are also reflected schematically in the process flow 200 shown in FIG. 26.

FIG. 1 illustrates a cross-sectional view of interposer wafer 20. Interposer wafer 20 may include substrate 22. In accordance with some embodiments, substrate 22 is a semiconductor substrate, which may further be a crystalline silicon substrate, although it may comprise other semiconductor materials such as silicon germanium, silicon carbon, or the like. In accordance with alternative embodiments, substrate 22 is a dielectric substrate. In accordance with some embodiments, interposer wafer 20 does not have active devices such as transistors and diodes therein. In these embodiments, interposer wafer 20 may or may not include passive devices such as capacitors, inductors, and resistors formed therein. In accordance with alternative embodiments, wafer 20 is a device wafer, which includes active devices such as transistors (not shown) formed at the top surface of semiconductor substrate 22. Through-vias (sometimes referred to as Through-Substrate Vias (TSVs)) 24 may be formed to extend from the top surface of substrate 22 into substrate 22. TVs 24 are also sometimes referred as through-silicon vias when formed in a silicon substrate. Although not shown in FIG. 1, each of TVs 24 may be encircled by an isolation liner 26 (FIG. 25), which is formed of a dielectric material such as silicon oxide, silicon nitride, or the like. Isolation liner 26 isolates the respective TV 24 from semiconductor substrate 22.

In the embodiments in which wafer 20 is an interposer wafer, interposer wafer 20 includes a plurality of interposers 40, which may be identical to each other. The substrate 22 in interposer wafer 20 may continuously extend throughout the entire interposer wafer 20, and the substrate 22 in the plurality of interposers 40 are interconnected without being separated from each other by dielectric regions. In accordance with alternative embodiments, wafer 20 may include device dies 40 (also known as chips), which may be logic/core dies, memory dies, analog dies, or the like.

Interconnect structure 28 is formed over semiconductor substrate 22, and is used to electrically connect to TVs 24. Interconnect structure 28 may include a plurality of dielectrics layers 30. Metal lines 32 are formed in dielectric layers 30. Vias 34 are formed between, and interconnecting, the overlying and underlying metal lines 32. Metal lines 32 and vias 34 are sometimes referred to as Redistribution Layer (RDL) 32/34. In accordance with some embodiments, dielectric layers 30 is formed of silicon oxide, silicon nitride, silicon carbide, silicon oxynitride, combinations thereof, and/or multi-layers thereof. Alternatively, dielectric layers 30 may comprise one or more low-k dielectric layer having low k values. The k values of the low-k dielectric materials in dielectric layers 30 may be lower than about 3.0, or lower than about 2.5, for example.

Electrical connectors 36 are formed at the top surface of interposer wafer 20. In accordance with some embodiments, electrical connectors 36 comprise metal pillars, wherein solder caps may be, or may not be, formed on the top surfaces of the metal pillars. In accordance with alternative embodiments, electrical connectors 36 comprise solder regions. In yet other embodiments, electrical connectors 36 may be composite bumps comprising copper posts, nickel layers, solder caps, Electroless Nickel Immersion Gold (ENIG), Electroless Nickel Electroless Palladium Immersion Gold (ENEPIG), and/or the like.

Further referring to FIG. 1, package components 42 are bonded to interposers 40, for example, through flip-chip bonding. The respective process is illustrated as process 202 in the process flow 200 shown in FIG. 26. Electrical connectors 38 electrically couple the circuits in package components 42 to RDLs 32/34 and TVs 24 in interposer wafer 20 through electrical connectors 36. Package components 42 may be device dies comprising logic circuits, memory circuits, or the like. Accordingly, package components 42 are alternatively referred to as dies 42 hereinafter. In accordance with other embodiments of the present disclosure, package components 42 comprise packages including dies bonded to the respective interposers, package substrates, and/or the like. On each of interposers 40, there may be a single one, two, or more, dies 42 bonded thereon.

Figure 2:
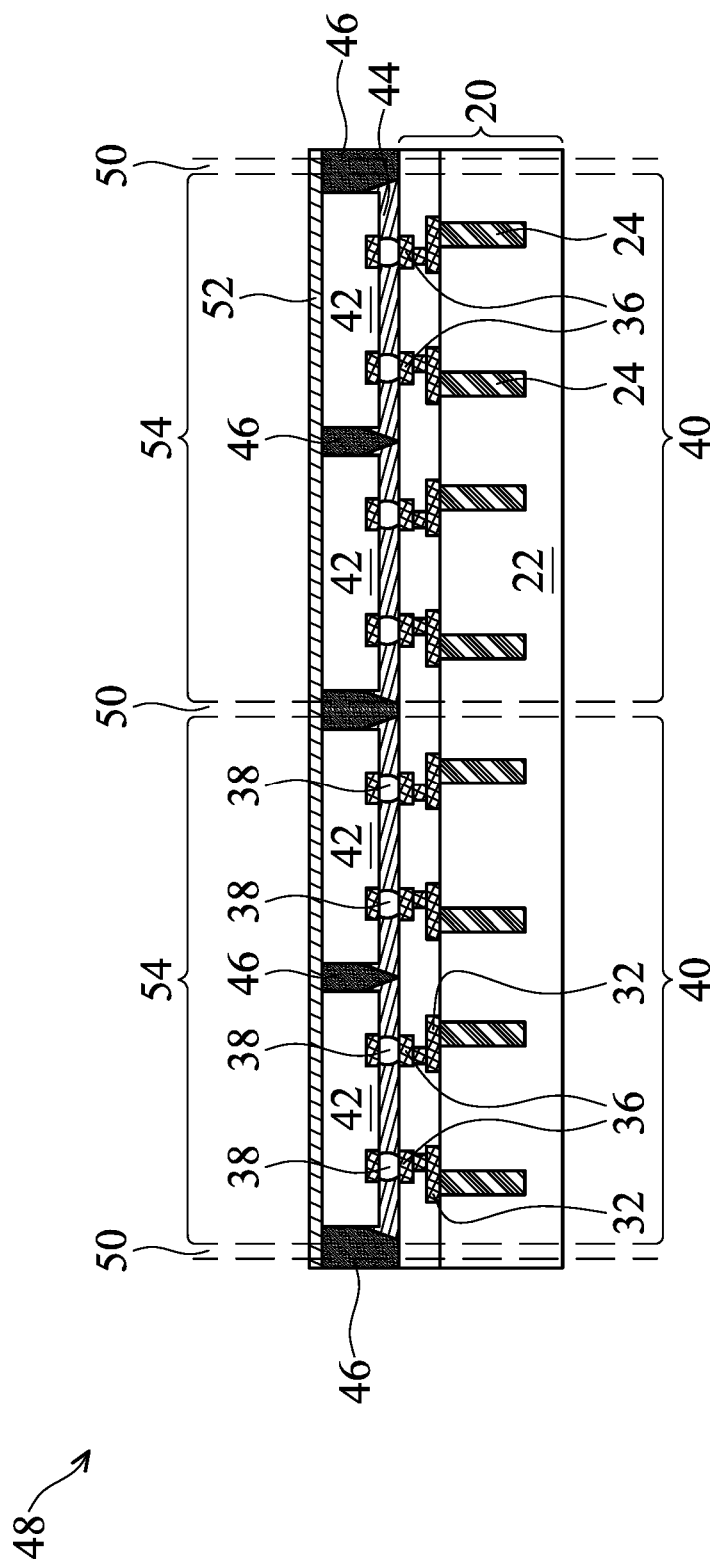

Next, as shown in FIG. 2, underfill 44 is dispensed into the space (gaps) between dies 42 and interposer wafer 20. Underfill 44 may include a polymer, a resin, an epoxy, or the like, as a base material, and may include filler particles therein. The filler particles may be formed of silica, aluminum oxide, or the like, and may have spherical shapes. Underfill 44 is then cured in a curing process. The curing process may include a thermal curing process or a Ultra-Violet (UV) curing process, depending on the type of underfill 44.

After the underfill 44 is applied, device dies 42 are encapsulated in encapsulant 46. The respective process is illustrated as process 204 in the process flow 200 shown in FIG. 26. Encapsulant 46 may be a molding compound, a molding underfill, or the like. The top surface of encapsulant 46 is higher than the top surfaces of device dies 42. In accordance with alternative embodiments, underfill 44 and encapsulant 46 are applied in a same process, for example, using a molding underfill.

Figure 3:
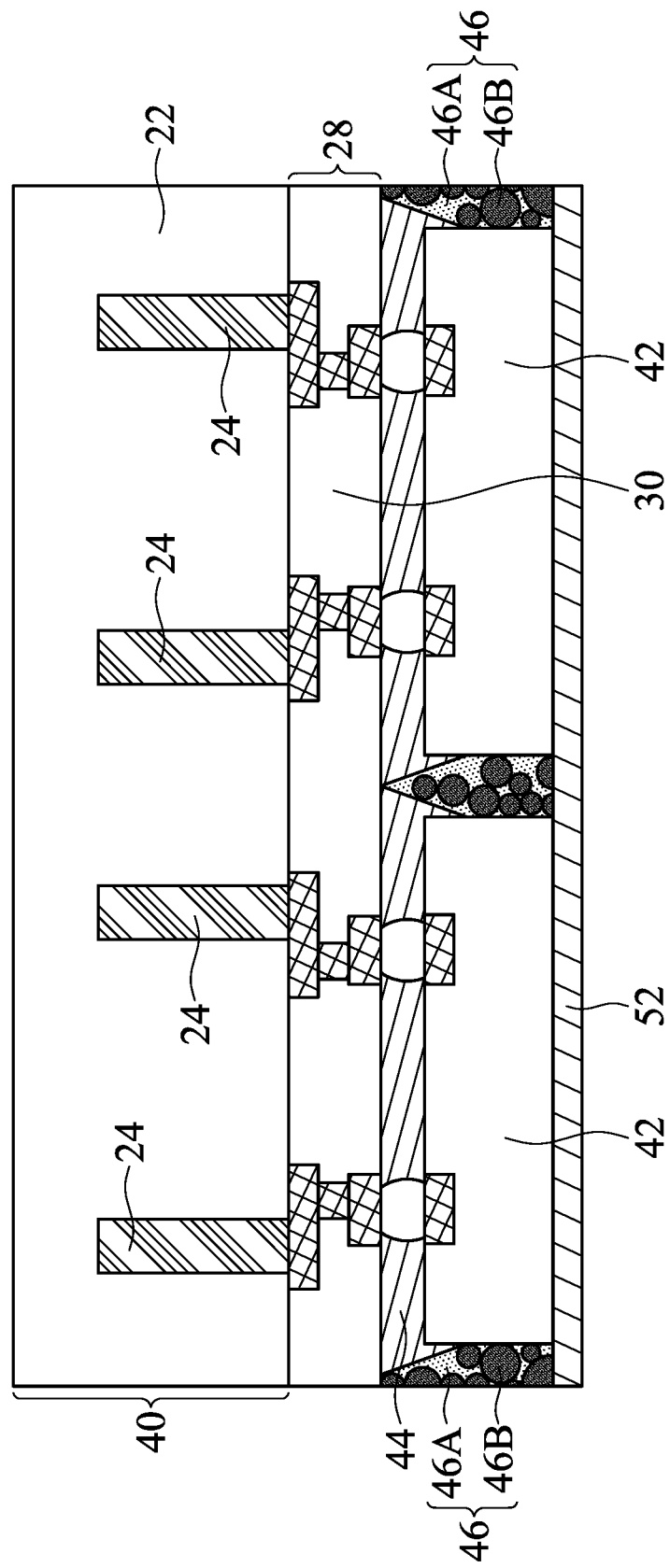

FIG. 3 schematically illustrates some details of encapsulant 46. Encapsulant 46 may include base material 46A, which may be a polymer, a resin, an epoxy, or the like, and filler particles 46B in the base material 46A. The filler particles 46B may be the particles of a dielectric material(s) such as $SiO_2$, $Al_2O_3$, silica, the dielectric compound of iron (Fe), the dielectric compound of sodium (Na), or the like, and may have spherical shapes. Also, the spherical filler particles 46B may have the same or different diameters, as illustrated in FIG. 3 in accordance with some examples.

Referring back to FIG. 2, encapsulant 46 is cured, followed by a planarization process, which may be a Chemical Mechanical Polish (CMP) process or a mechanical polish process. In accordance with some embodiments of the present disclosure, after the planarization process, the top surfaces (which may be the top surfaces of semiconductor substrates) of some or all device dies 42 are revealed. In accordance with some embodiments of the present disclosure, after the planarization process, device dies 42 are covered by a layer of remaining encapsulant 46.

Throughout the description, the structures including interposer wafer 20, dies 42, underfill 44, and encapsulant 46 are collectively referred to as reconstructed wafer 48. Reconstructed wafer 48 is also referred to as a CoW wafer. In accordance with some embodiments, Die-Attach Film (DAF) 52, which is an adhesive film, may be adhered to the top surface of reconstructed wafer 48 before the singulation process, and the DAF is sawed along with reconstructed wafer 48.

After the planarization process, a singulation process is performed to separate reconstructed wafer 48 into individual packages 54. The respective process is illustrated as process 206 in the process flow 200 shown in FIG. 26. The singulation process may be performed along the scribe lines 50 of interposer wafer 20. One of the resulting packages 54 (sometimes referred to as a CoW die or a CoW package) is illustrated in FIG. 3. The sawed DAF 52 is attached to package 54, and may be in contact with encapsulant 46 and the semiconductor substrates (not shown separately) of dies 42.

FIG. 3 illustrates an example of package 54. As a result of the planarization process, some of filler particles 46B are polished partially, causing some of the filler particles 46B to have some portions (bottom portions in FIG. 3) removed, and top portions remaining. The resulting partial filler particles 46B will thus have bottom surfaces to be planar, which planar bottom surfaces are coplanar with the bottom surface of base material 46A and the semiconductor substrates of device dies 42. Furthermore, due to the singulation process, some of filler particles 46B are sawed, causing some of the filler particles 46B to have some portions (such as the left portions of the leftmost filler particles 46B as shown in FIG. 3) removed. The resulting partial filler particles 46B will thus have either left or right surfaces (sidewalls) to be planar, which planar surfaces are coplanar (flush) with the sidewalls of base material 46A.

FIGS. 4 through 20 illustrate the formation of a fan-out package, with packages 54 packed therein. Referring to FIG.

4, carrier 60 is provided, and release film 62 is coated on carrier 60. Carrier 60 is formed of a transparent material, and may be a glass carrier, a ceramic carrier or the like. Carrier 60 may have a round top-view shape, and may have a size of a silicon wafer. Release film 62 may be formed of a Light-To-Heat-Conversion (LTHC) coating material. Release film 62 may be applied onto carrier 60 through coating. In accordance with some embodiments of the present disclosure, the LTHC coating material is capable of being decomposed under the heat of light/radiation (such as laser), and hence can release carrier 60 from the structure formed thereon.

Figure 4:
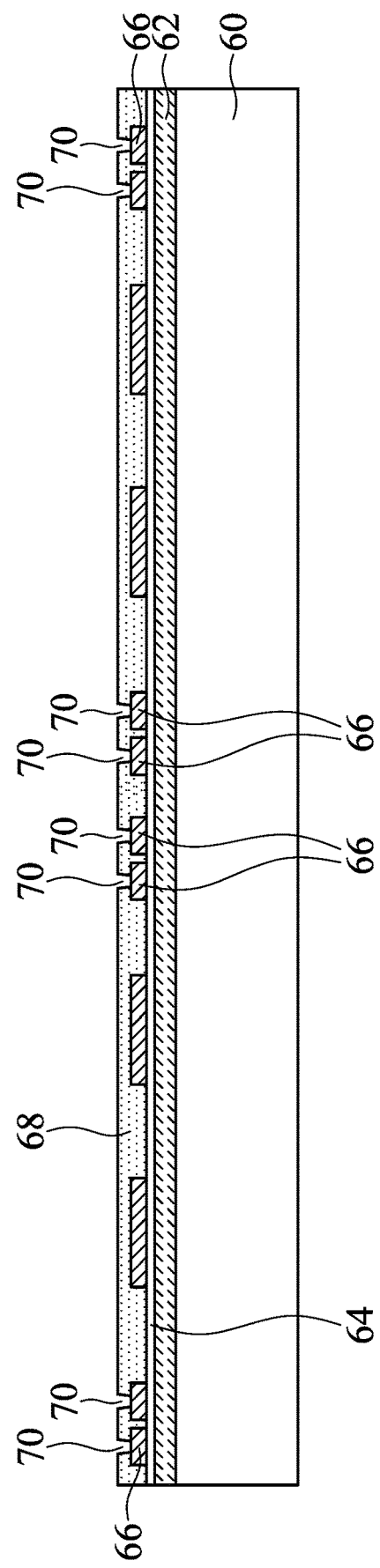

In accordance with some embodiments, as shown in FIG. 4, buffer layer 64 is formed on release film 62. Polymer buffer layer 64 may be formed of a dielectric material, which may be a polymer such as polybenzoxazole (PBO), polyimide, benzocyclobutene (BCB), or the like. Redistribution Lines (RDLs) 66 are formed over buffer layer 64. The respective process is illustrated as process 208 in the process flow 200 shown in FIG. 26. The formation of RDLs 66 may include forming a seed layer (not shown) over buffer layer 64, forming a patterned mask (not shown) such as a patterned photo resist over the seed layer, and then performing a metal plating process to form RDLs 66. The patterned mask and the portions of the seed layer covered by the patterned mask are then removed, leaving RDLs 66 as in FIG. 4. In accordance with some embodiments of the present disclosure, the seed layer includes a titanium layer and a copper layer over the titanium layer. The seed layer may be formed using, for example, Physical Vapor Deposition (PVD). The plating may be performed using, for example, electro-chemical plating or electro-less plating.

Further referring to FIG. 4, dielectric layer 68 is formed on RDLs 66. The respective process is illustrated as process 210 in the process flow 200 shown in FIG. 26. The bottom surface of dielectric layer 68 may be in contact with the top surfaces of RDLs 66 and buffer layer 64. In accordance with some embodiments of the present disclosure, dielectric layer 68 is formed of a polymer, which may be a photo-sensitive material such as PBO, polyimide, or the like. In accordance with alternative embodiments, dielectric layer 68 is formed of a nitride such as silicon nitride, an oxide such as silicon oxide, or the like. Dielectric layer 68 is then patterned to form openings 70 therein. Hence, some pad portions of RDLs 66 are exposed through the openings 70 in dielectric layer 68.

Figure 5:
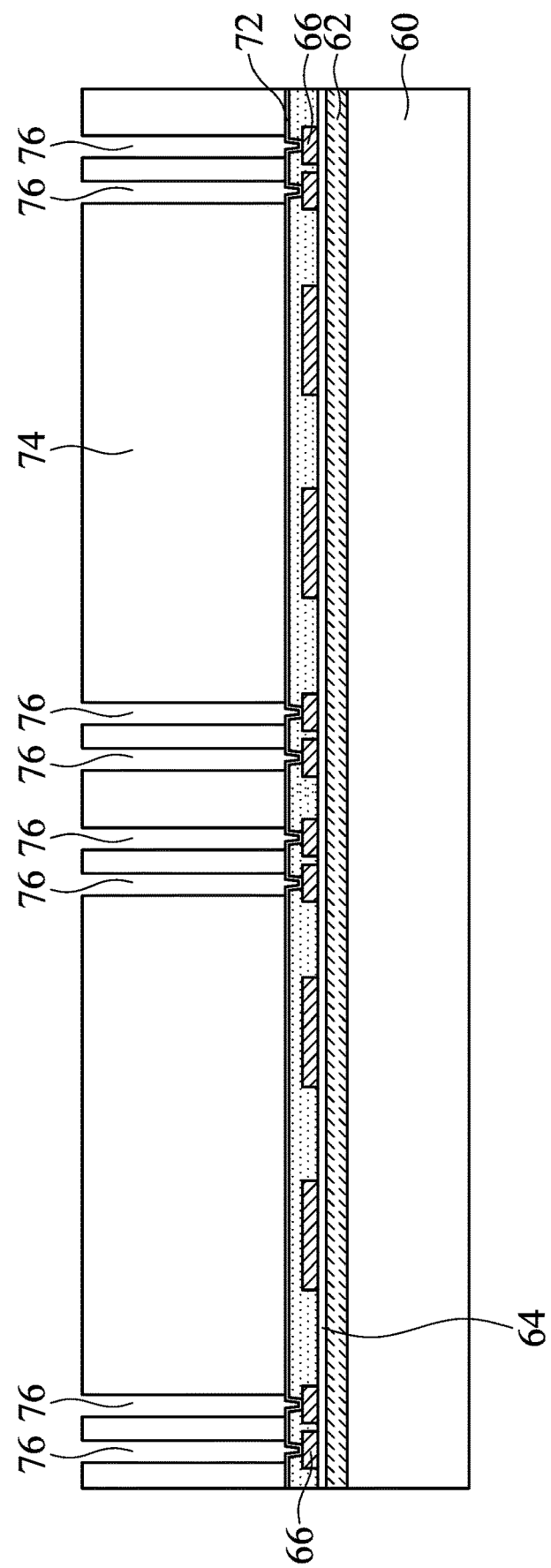

Referring to FIG. 5, metal seed layer 72 is formed, for example, through PVD. The respective process is illustrated as process 212 in the process flow 200 shown in FIG. 26. In accordance with some embodiments of the present disclosure, metal seed layer 72 includes a titanium layer and a copper layer over the titanium layer. In accordance with alternative embodiments of the present disclosure, metal seed layer 72 includes a copper layer in contact with buffer layer 64.

As also shown in FIG. 5, a plating mask such as a photo resist 74 is formed over metal seed layer 72. The respective process is illustrated as process 214 in the process flow 200 shown in FIG. 26. A light-exposure process is then performed on photo resist 74 using a photo lithography mask (not shown). After a subsequent development process of photo resist 74, openings 76 are formed in photo resist 74. Some portions of metal seed layer 72 are exposed through openings 76.

Figure 6:
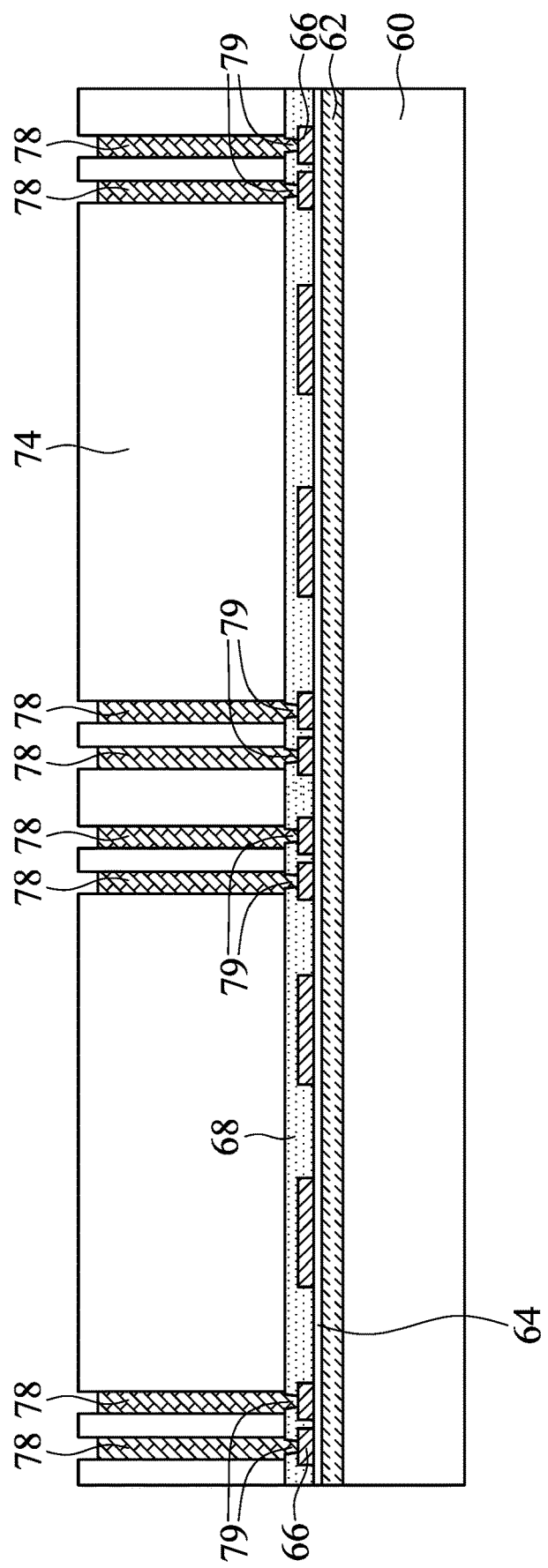

Next, as shown in FIG. 6, metal posts 78 are formed by plating a metallic material in openings 76. The respective process is illustrated as process 216 in the process flow 200 shown in FIG. 26. In the same seed formation and plating processes, vias 79 are also formed, and extend into dielectric layer 68 to contact RDLs 66. Metal posts 78 are alternatively referred to as through-vias or through-molding vias since they will penetrate through the subsequently formed encapsulating material (which may be a molding compound) in the final package. The plated metallic material may be copper or a copper alloy. The top surfaces of metal posts 78 are lower than the top surface of photo resist 74, so that the shapes of metal posts 78 are confined by openings 76. Metal posts 78 may have substantially vertical and straight edges. Alternatively, metal posts 78 may have a sand timer shape in a cross-sectional view, with the middle parts of metal posts 78 being narrower than the respective top pails and bottom pails.

Figure 7:
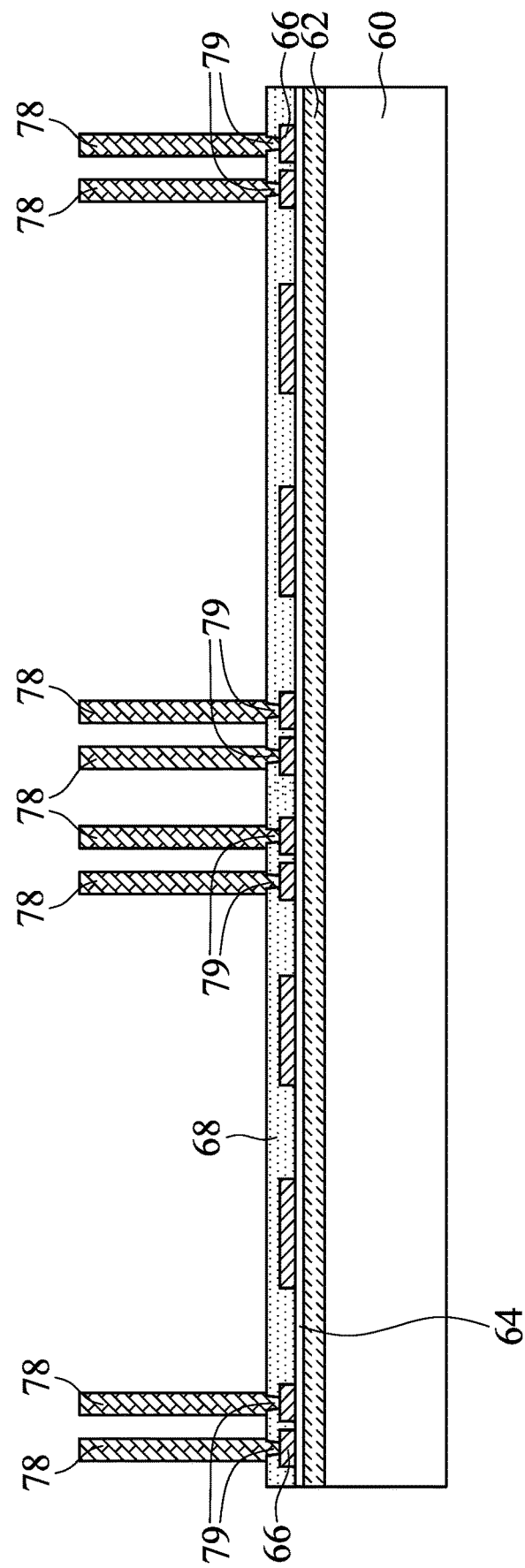

In subsequent steps, photo resist 74 is removed, and the underlying portions of metal seed layer 72 are exposed. The exposed portions of metal seed layer 72 are then removed in an etching process, for example, an anisotropic etching step or an isotropic etching step. The edges of the remaining seed layer 72 may thus be co-terminus or substantially co-terminus with the respective overlying portions of metal posts 78. The resulting metal posts 78 are illustrated in FIG. 7. Throughout the description, the remaining portions of metal seed layer 72 directly underlying the plated metal posts 78 are considered as parts of metal posts 78. The top-view shapes of metal posts 78 include, and are not limited to, circular shapes, rectangles, hexagons, octagons, and the like. After the formation of metal posts 78, dielectric layer 68 is exposed.

Figure 8:
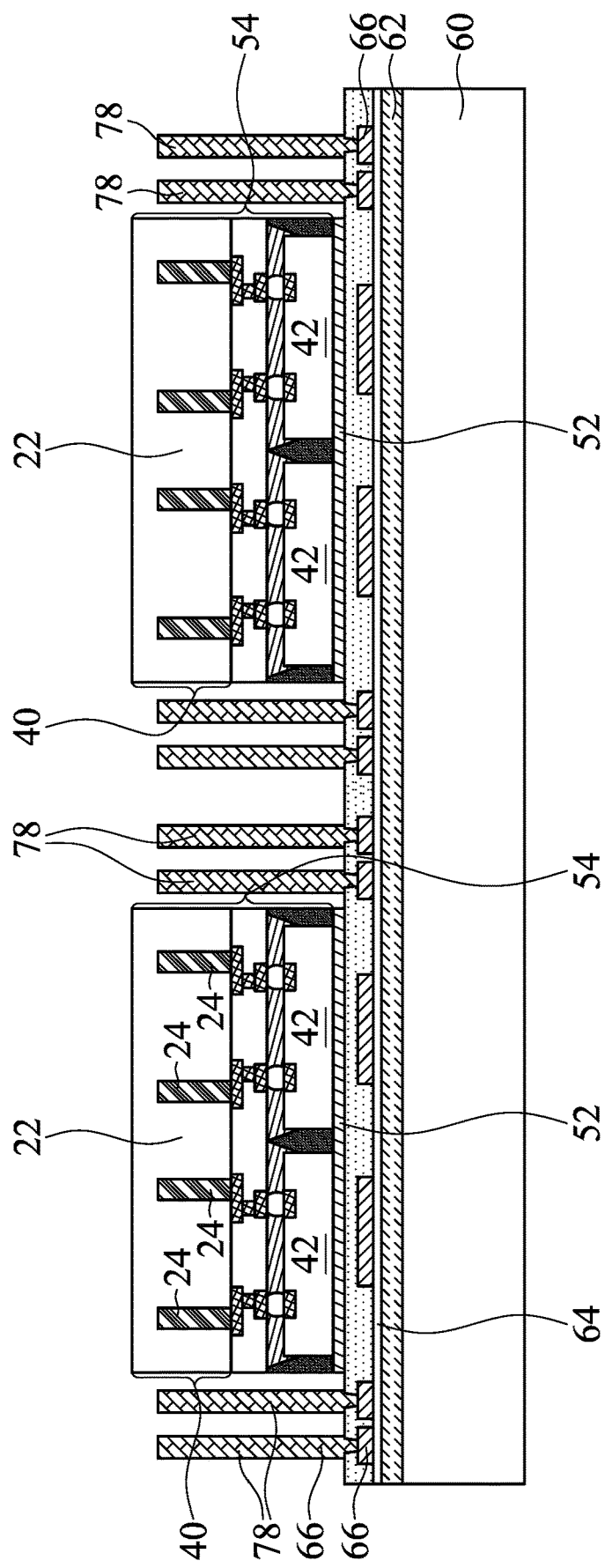
Figure 9:
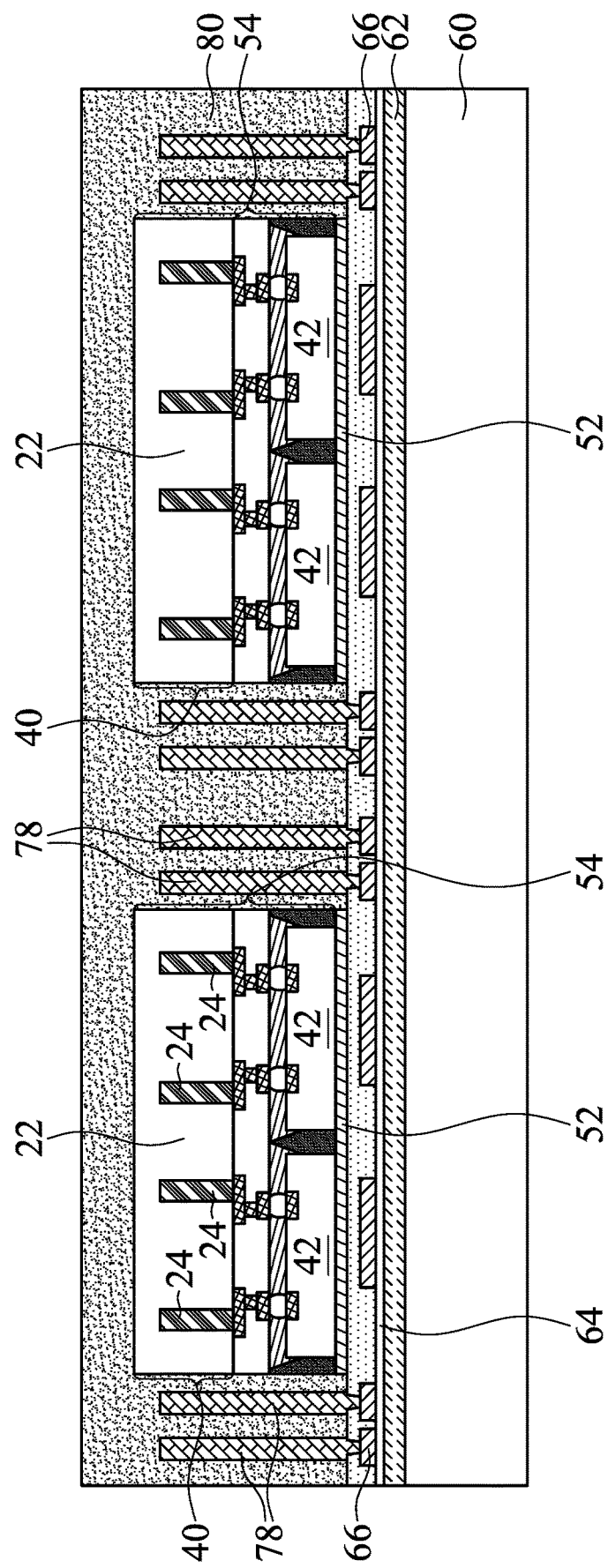
Figure 25:
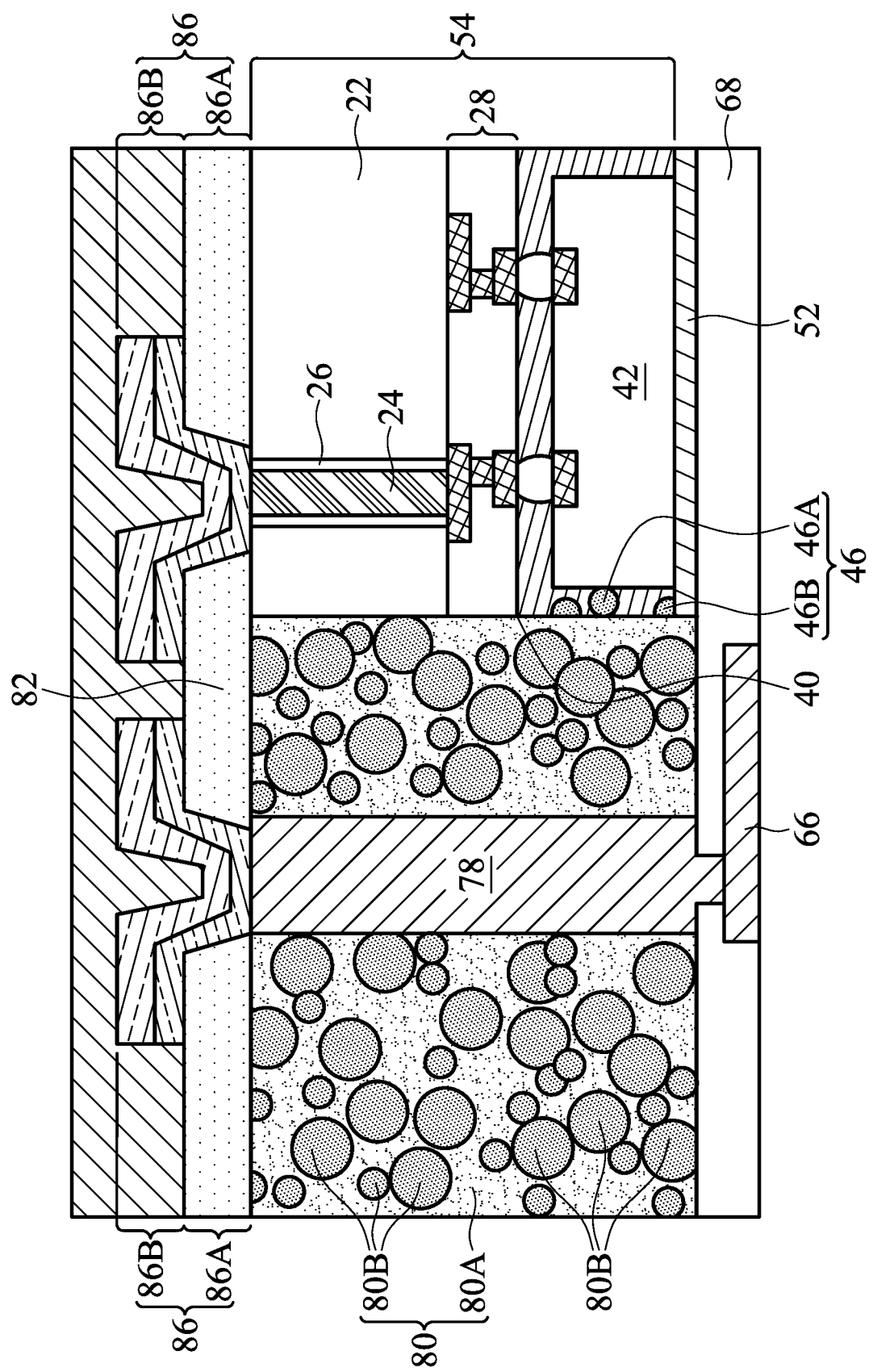
FIG. 25 illustrates a magnified view of a part of a package in accordance with some embodiments.

FIG. 8 illustrates the placement/attachment of CoW packages 54, with DAFs 52 adhere the respective packages 54 to dielectric layer 68. The respective process is illustrated as process 218 in the process flow 200 shown in FIG. 26. Next, packages 54 and metal posts 78 are encapsulated in encapsulant 80, as shown in FIG. 9. The respective process is illustrated as process 220 in the process flow 200 shown in FIG. 26. Encapsulant 80 fills the gaps between neighboring through-vias 78 and the gaps between through-vias 78 and packages 54. Encapsulant 80 may include a molding compound, a molding underfill, an epoxy, and/or a resin. The top surface of encapsulant 80 is higher than the top ends of metal posts 78 and the top surfaces of packages 54. The molding compound may include a base material 80A (not shown in FIG. 9, refer to FIG. 25), which may be a polymer, a resin, an epoxy, or the like, and filler particles 80B (not shown) in the base material. The filler particles may be dielectric particles of $SiO_2$, $Al_2O_3$, silica, or the like, and may have spherical shapes. Also, the spherical filler particles may have the same or different diameters. The base material 80A and filler particles 80B are shown in FIG. 25.

Figure 10:
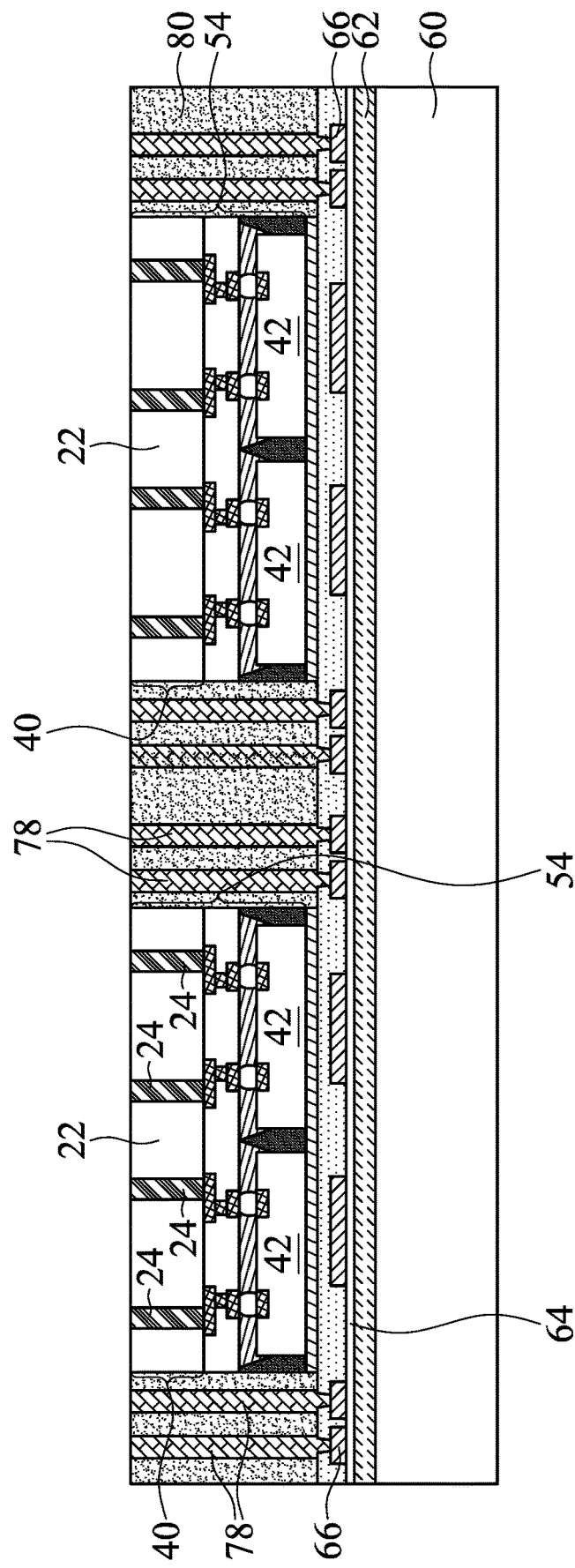

In a subsequent step, as shown in FIG. 10, a planarization step such as a CMP step or a mechanical grinding step is performed to thin encapsulant 80 and the substrates 22 in interposers 40. Both encapsulant 80 and substrates 22 in dies 40 are polished. In accordance with some embodiments of the present disclosure, the planarization process is performed until both metal posts 78 and through-vias 24 in interposers 40 are exposed. Also, the isolation liners 26 (FIG. 25) encircling through-vias 24 are also revealed. Due to the planarization process, the top ends of through-vias 24 and metal posts 78 are level (coplanar) with the top surfaces of encapsulant 80. Metal posts 78 are alternatively referred to as through-vias 78 hereinafter since they penetrate through encapsulant 80.

Figure 11:
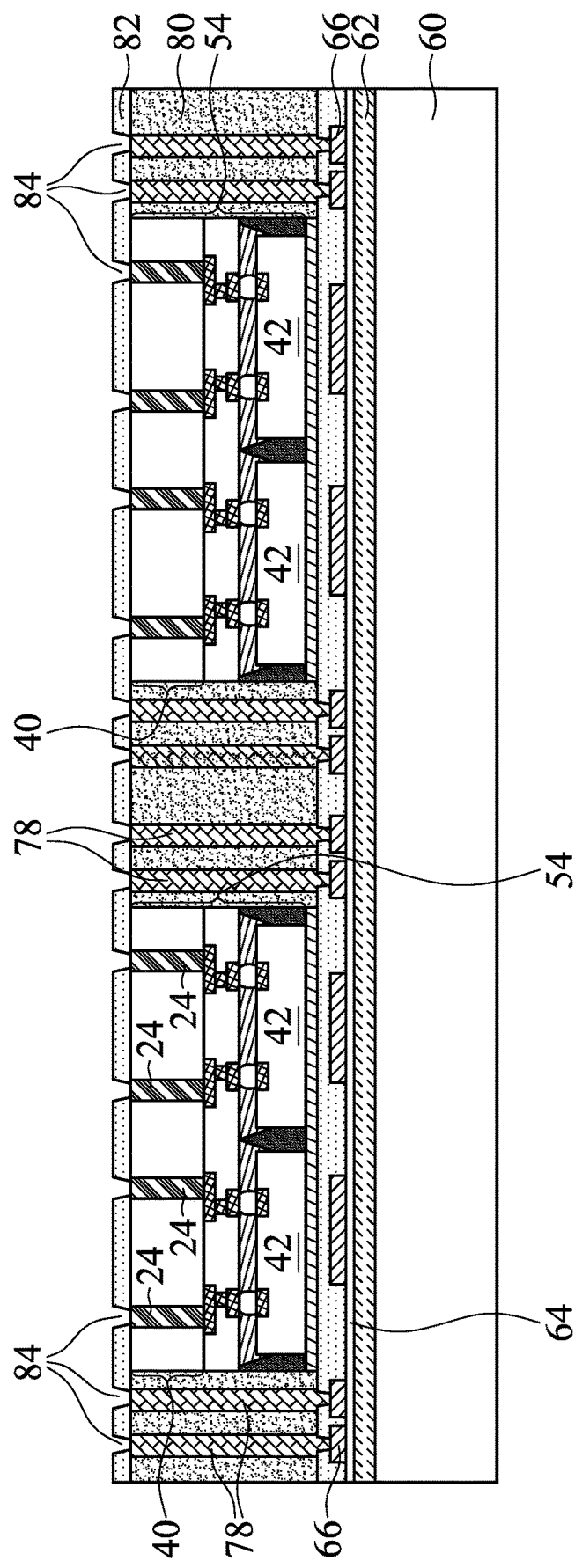
Figure 12:
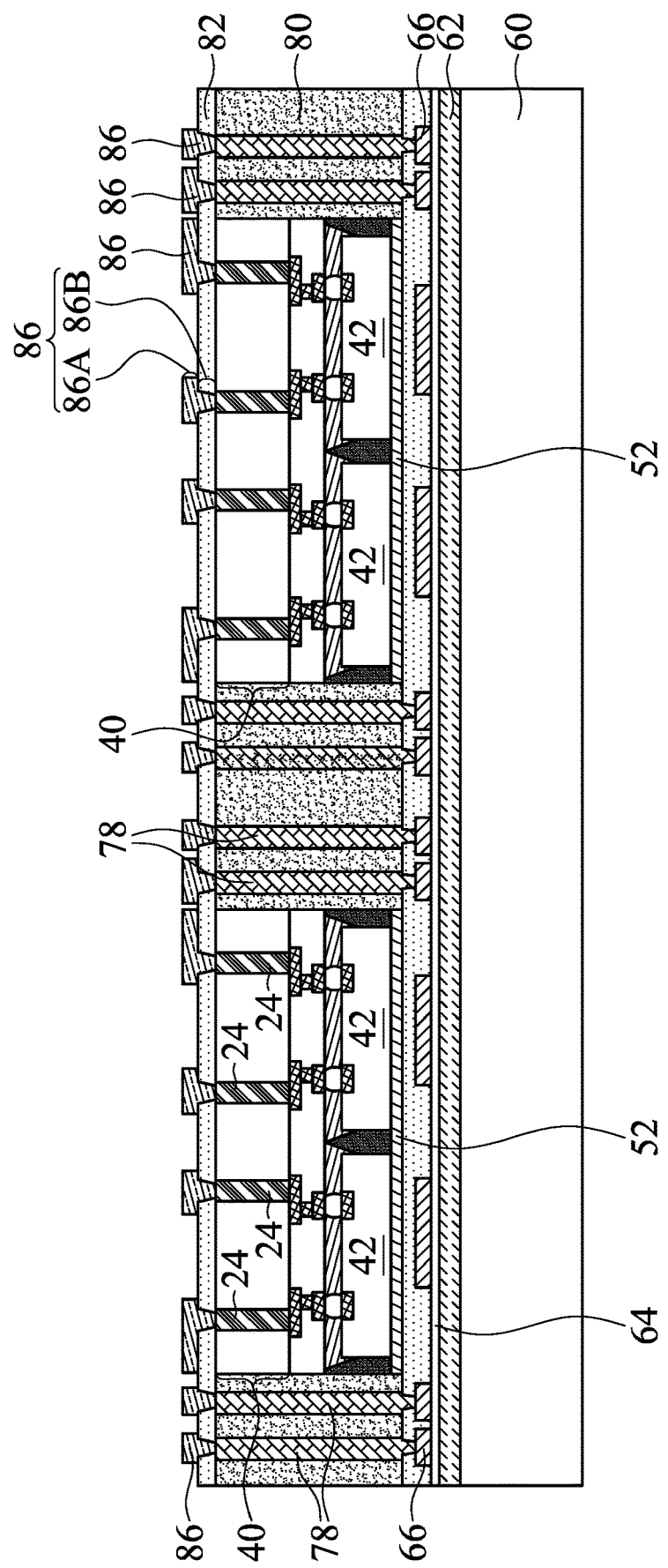
Figure 13:
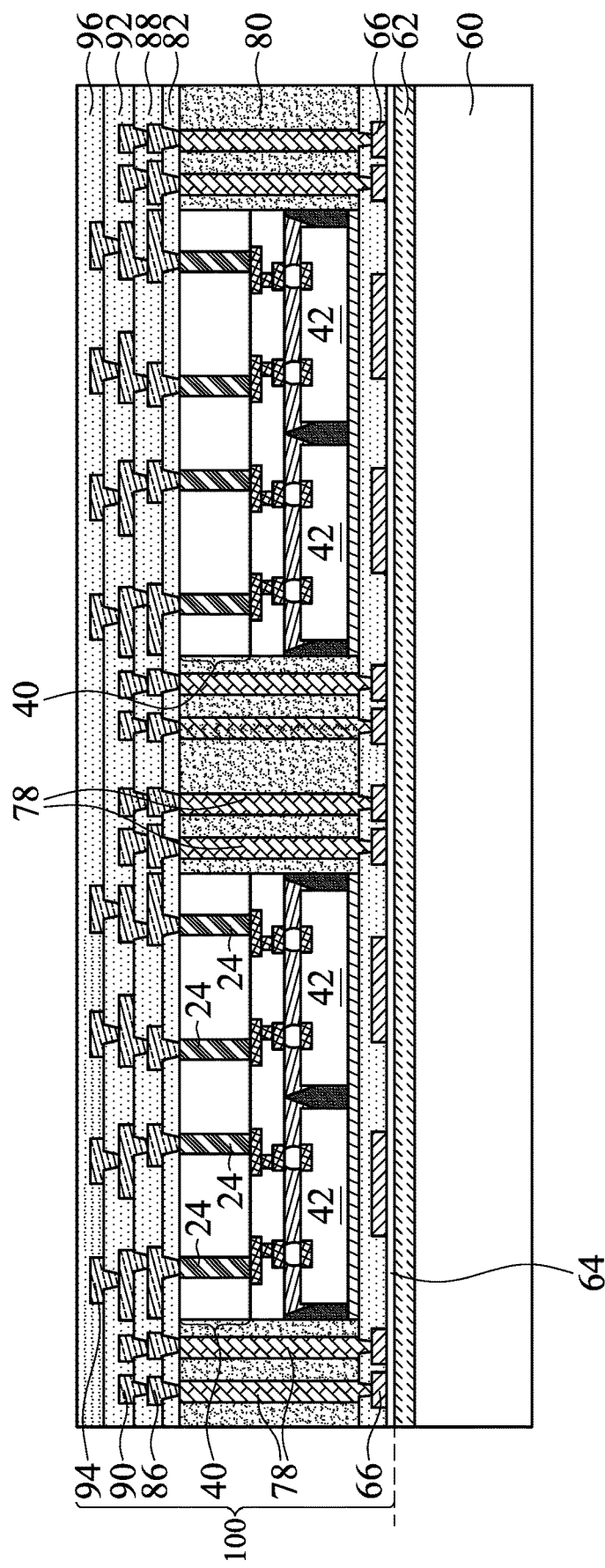

FIGS. 11 through 13 illustrate the formation of a redistribution structure overlying and connecting to packages 54 and metal posts 78. The respective process is illustrated as process 222 in the process flow 200 shown in FIG. 26. FIGS. 11 and 12 illustrate the formation of a first layer of RDLs and the respective dielectric layer. Referring to FIG. 11, dielectric layer 82 is formed. In accordance with some embodiments of the present disclosure, dielectric layer 82 is formed of a polymer such as PBO, polyimide, or the like. The formation method includes coating dielectric layer 82 in a flowable form, and then curing dielectric layer 82. In accordance with alternative embodiments of the present disclosure, dielectric layer 82 is formed of an inorganic dielectric material such as silicon nitride, silicon oxide, or the like. The formation method may include Chemical Vapor Deposition (CVD), Atomic Layer Deposition (ALD), Plasma-Enhanced Chemical Vapor Deposition (PECVD), or other applicable deposition methods. Openings 84 are then formed, for example, through a photo lithography process. In accordance with some embodiments in which dielectric layer 82 is formed of a photo sensitive material such as PBO or polyimide, the formation of openings 84 involves a photo exposure process on dielectric layer 82 using a lithography mask (not shown), and a development of the exposed dielectric layer 82. Through-vias 24 and 78 are exposed through openings 84.

Next, referring to FIG. 12, RDLs 86 are formed. RDLs 86 include vias 86A formed in dielectric layer 82 to contact through-vias 24 and 78, and metal traces (metal lines) 86B over dielectric layer 82. In accordance with some embodiments of the present disclosure, RDLs 86 are formed in a plating process, which includes depositing a metal seed layer (not shown), forming and patterning a photo resist (not shown) over the metal seed layer, and plating a metallic material such as copper and/or aluminum over the metal seed layer. The metal seed layer and the plated metallic material may be formed of the same material or different materials. The patterned photo resist is then removed, followed by etching the portions of the metal seed layer previously covered by the patterned photo resist. FIG. 25 illustrates an amplified view of one of RDLs 86 and dielectric layer 82.

Referring to FIG. 13, more dielectric layers are formed over dielectric layer 82, and more RDLs are formed over and connecting to RDLs 86. The dielectric layers include dielectric layers 88, 92 and 96 in some examples. The RDLs include RDLs 90 and 94 in some examples. Dielectric layers 88, 92 and 96 may be formed using a material selected from the same or different group of candidate materials for forming dielectric layer 82, which may include PBO, polyimide, BCB, or other organic or inorganic materials. The material and the formation process of RDLs 90 and 94 may be the same as the formation of RDLs 86, which includes forming a seed layer, forming a patterned mask, plating RDLs 90 and 94, and then removing the patterned mask and undesirable portions of the seed layer. Throughout the description, the components over release film 62 are collectively referred to as reconstructed wafer 100.

As shown in FIG. 25, RDLs 86 may include vias 86A in dielectric layer 82 and metal lines 86B over dielectric layer 82. The top surfaces of some portions of RDLs 86 formed from openings 84 (FIG. 11) may be recessed lower than the top surfaces of metal lines 86B directly overlying dielectric layer 82. The RDLs formed over RDLs 86 such as RDLs 90 and 94 may have the similar profile.

Figure 14:
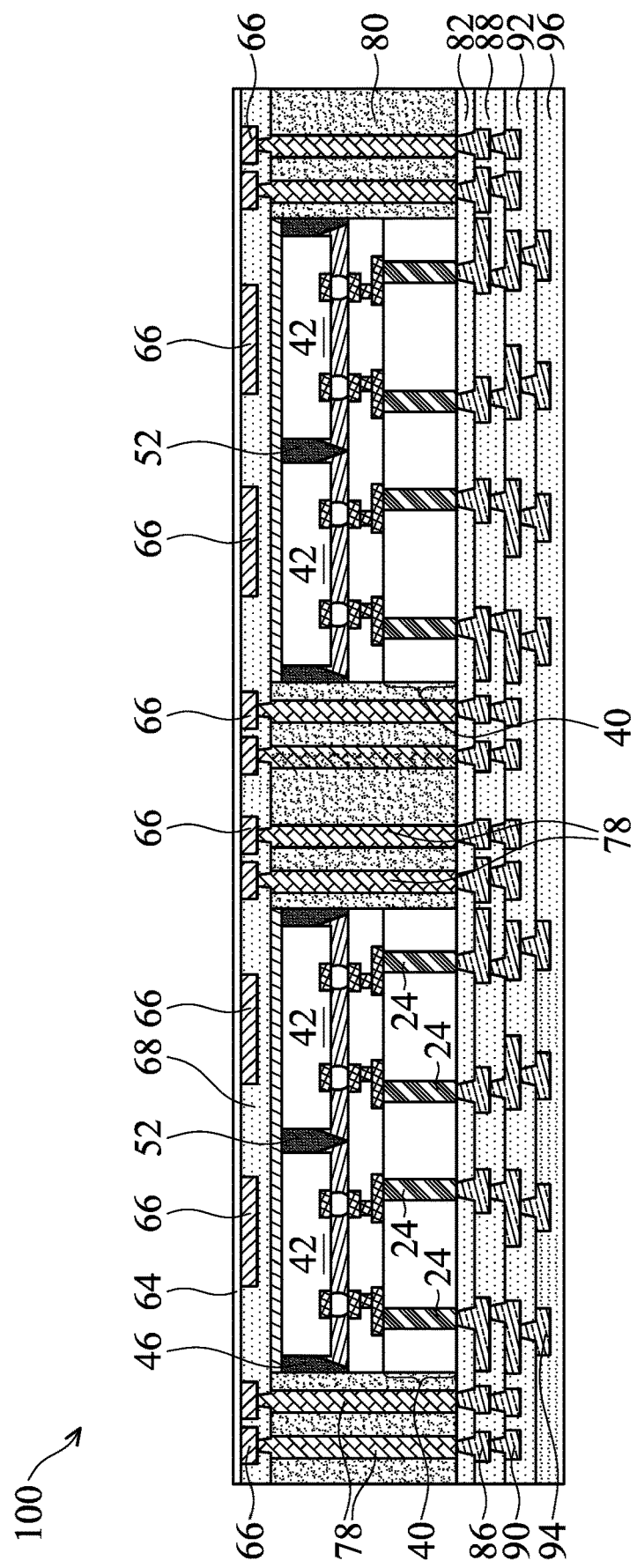

Next, reconstructed wafer 100 as shown in FIG. 13 is de-bonded from carrier 60. The respective process is illustrated as process 224 in the process flow 200 shown in FIG. 26. The de-bonding may be performed by projecting a light beam (such as a laser beam) on release film 62, so that the heat resulted from the light beam causes the decomposing of release film 62, and reconstructed wafer 100 is released from carrier 60. The residue of release film 62 is then removed, for example, through a plasma cleaning step. The resulting reconstructed wafer 100 is shown in FIG. 14.

Figure 15:
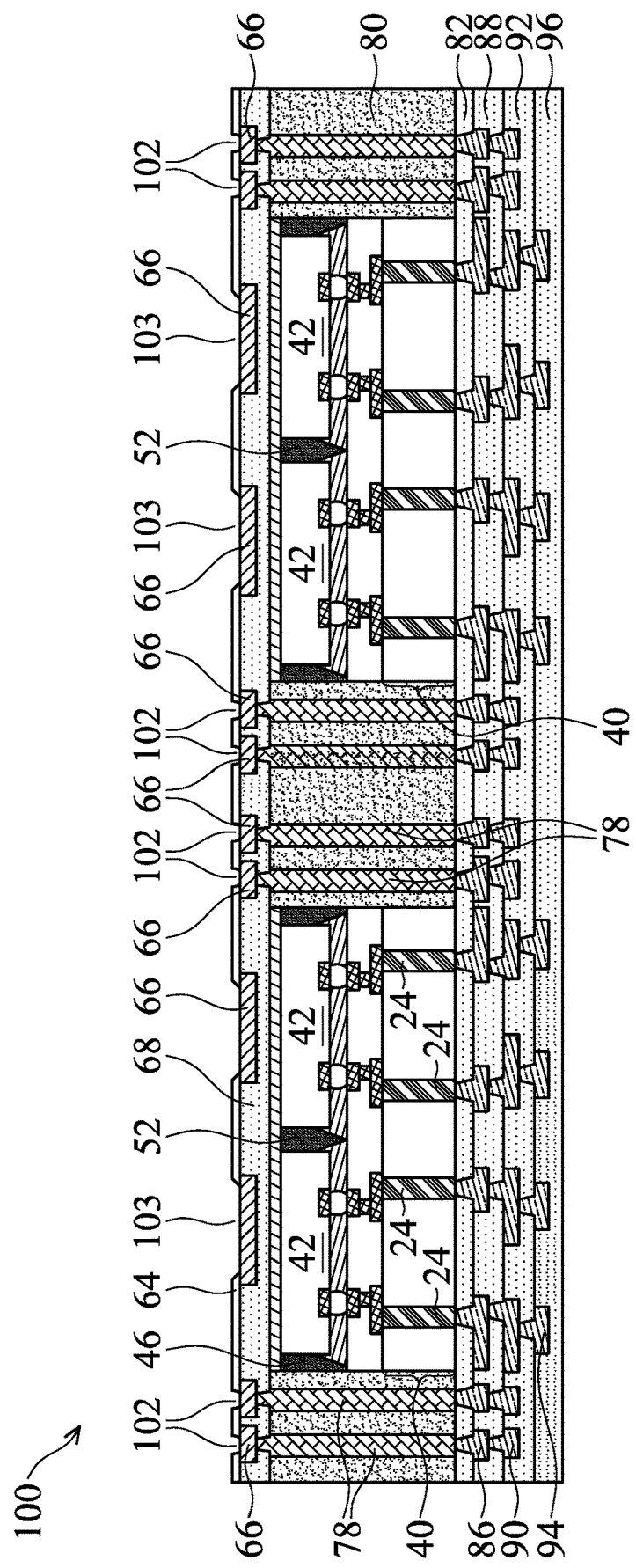

FIG. 15 illustrates the formation of openings 102 in buffer layer 64. In accordance with some embodiments, openings 102 are formed through laser drill using a laser beam. The respective process is illustrated as process 226 in the process flow 200 shown in FIG. 26. RDLs 66 act as the stop layer for the laser beam, and some portions of RDLs 66 are exposed through openings 102. In accordance with some embodiments, openings 103 are also formed to expose some portions of RDLs 66. In accordance with other embodiments, openings 103 are not formed. Openings 103 may be used for heat dissipation. For example, in the final structure when the resulting package is packed, a Thermal Interface Material (TIM) may be dispensed into openings 103 to be in contact with RDLs 66, and the TIM is also in contact with a heat sink to dissipate heat into the heat sink.

Figure 16:
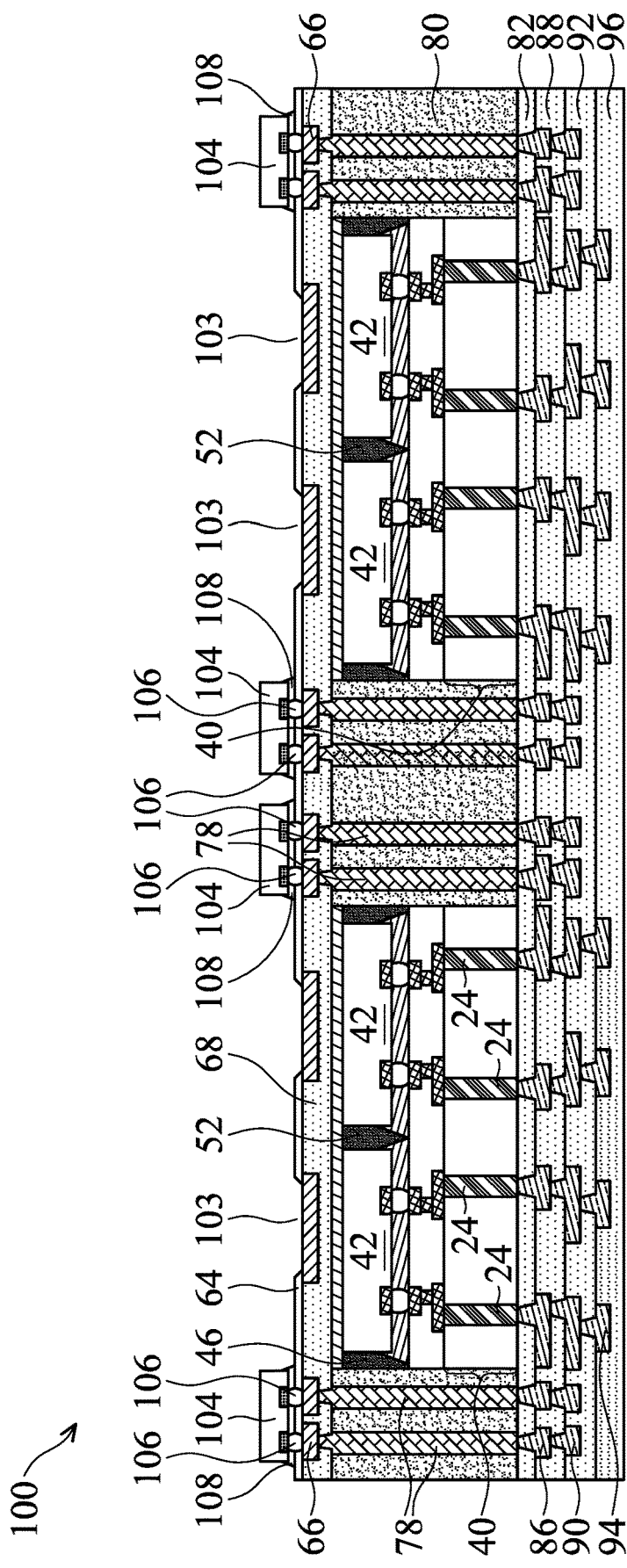

FIG. 16 illustrates the bonding of Integrated Passive Device (IPD) 104 to RDLs 66. The respective process is illustrated as process 228 in the process flow 200 shown in FIG. 26. In accordance with some embodiments, IPDs 104 include capacitors, inductors, resistors, or combinations thereof, which are formed as discrete device dies. The bonding may be through solder regions. Underfill 108 may be dispensed between IPDs 104 and reconstructed wafer 100.

Figure 17:
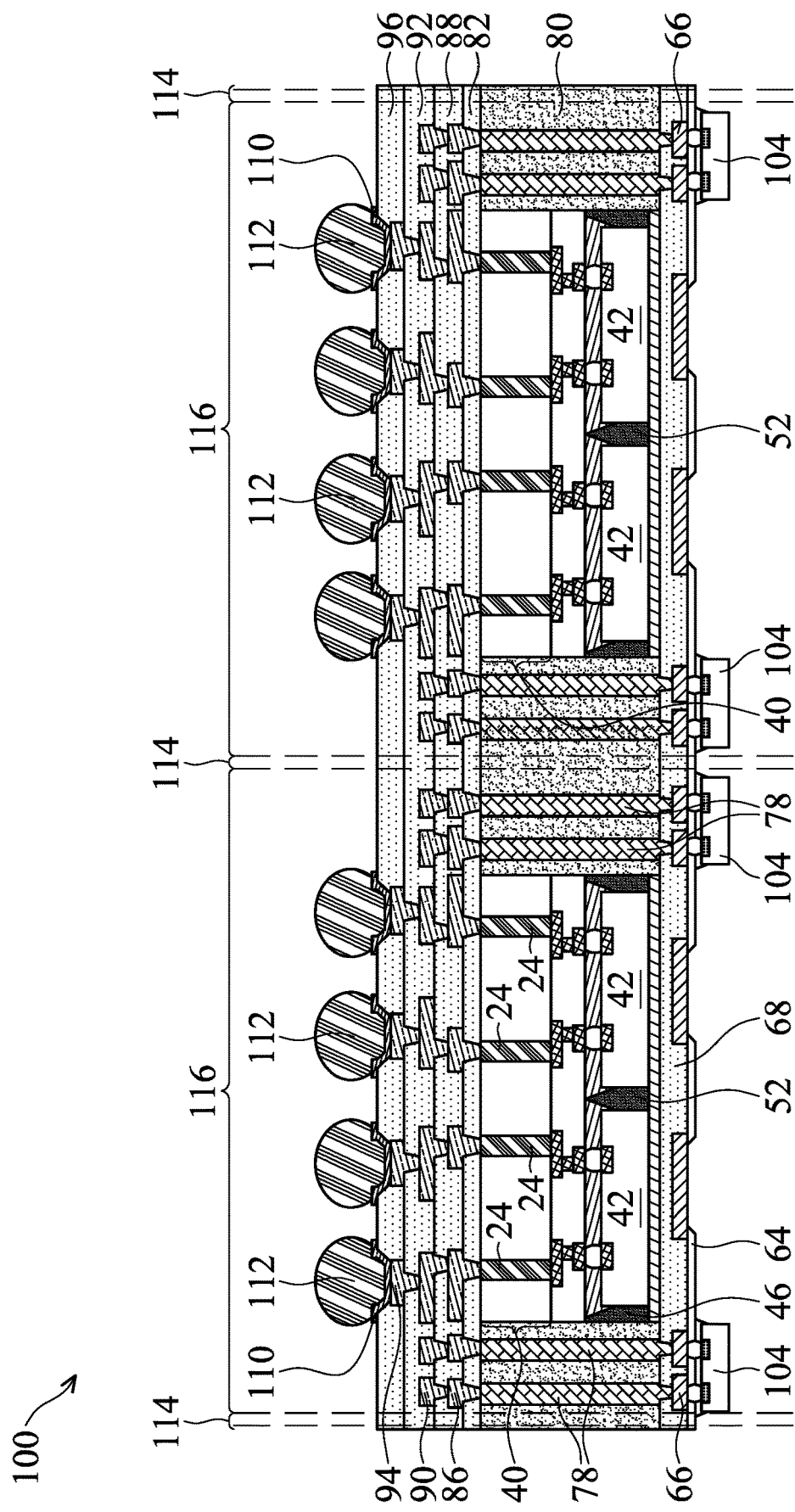

FIG. 17 illustrates the formation of Under-Bump Metallurgies (UBMs) 110 and electrical connectors 112 in accordance with some exemplary embodiments. The respective process is illustrated as process 230 in the process flow 200 shown in FIG. 26. In accordance with some embodiment of the present disclosure, UBMs 110 are formed to extend into the openings in dielectric layer 96 to contact the metal pads in RDLs 94. UBMs 110 may be formed of nickel, copper, titanium, or multi-layers thereof. In accordance with some exemplary embodiments, UBMs 110 include a titanium layer and a copper layer over the titanium layer.

Electrical connectors 112 are then formed. The formation of electrical connectors 112 may include placing solder balls on the exposed portions of UBMs 110, and then reflowing the solder balls. The resulting electrical connectors 112 are solder regions. In accordance with alternative embodiments of the present disclosure, the formation of electrical connectors 112 includes performing a plating step to form solder layers over UBMs 110, and then reflowing the solder layers. Electrical connectors 112 may also include non-solder metal pillars, or metal pillars and solder caps over the non-solder metal pillars, which may also be formed through plating.

Figure 18:
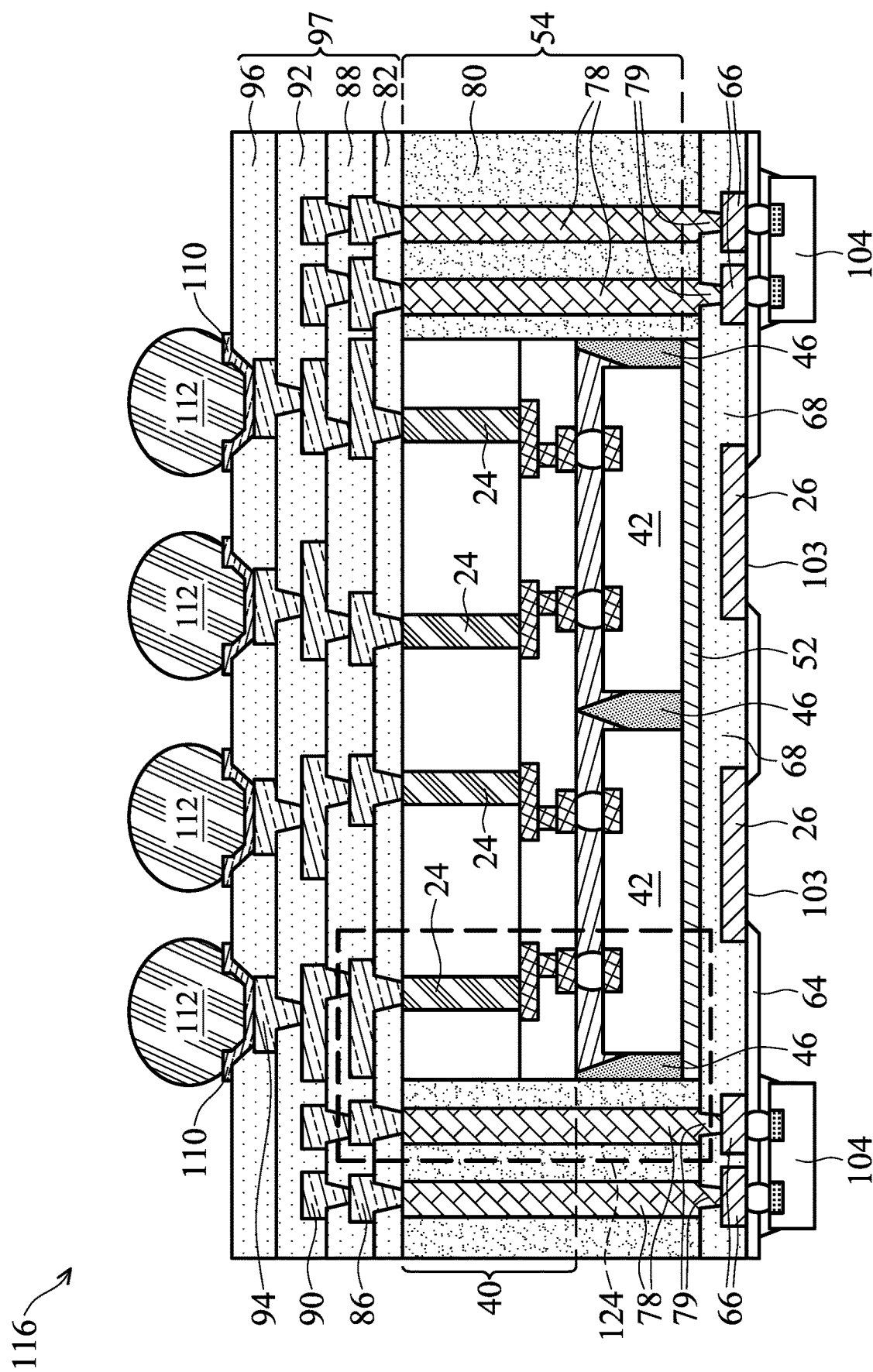
Figure 19:
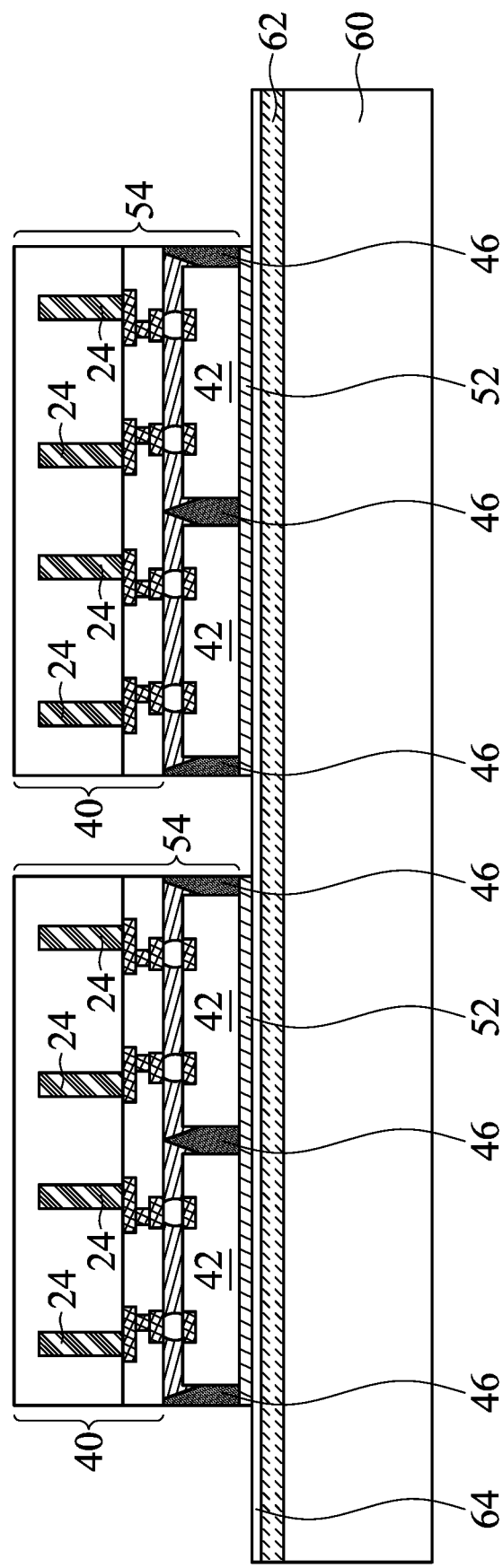
FIGS. 19 through 24 are cross-sectional views of intermediate stages in the formation of a package in accordance with some embodiments.

Next, reconstructed wafer 100 is placed on a dicing tape (not shown), which is attached to a frame (not shown). In accordance with some embodiments of the present disclosure, either electrical connectors 112 or IPDs 104 are in contact with the dicing tape. Next, reconstructed wafer 100 is singulated in a die-saw process, for example, using a blade. The respective process is illustrated as process 232 in the process flow 200 shown in FIG. 26. The kerves pass through scribe lines 114 of reconstructed wafer 100, and packages 116 are formed. FIG. 18 illustrates a resulting package 116 in accordance with some embodiments. Package 116 is also referred to as a chip-on-wafer-on-substrate package, or a CoWoS package, with RDLs 86, 90, and 94 and the corresponding dielectric layers 82, 88, 92, and 96 collectively acting as substrate 97. CoWoS package 116 differs from conventional CoWoS package in that substrate 97 is formed directly from the interposers 40 and encapsulant 8o in a fan-out process, rather being pre-formed (as cored or core-less package substrates) and bonded to the interposer.

FIGS. 19 through 24 illustrate cross-sectional views of intermediate stages in the formation of a package in accordance with alternative embodiments of the present disclosure. These embodiments are similar to the embodiments shown in FIGS. 1 through 18, except that no through-vias are formed at the same level as packages 54, no IPDs are attached, and RDLs are formed on one side, not on both sides, of package 54. Unless specified otherwise, the materials and the formation processes of the components in these embodiments are essentially the same as the like components, which are denoted by like reference numerals in the embodiments shown in FIGS. 1 through 18. The details regarding the formation process and the materials of the components shown in FIGS. 19 through 24 may thus be found in the discussion of the embodiments shown in FIGS. 1 through 18.

The initial steps of these embodiments are essentially the same as shown in FIGS. 1 through 3, in which packages 54 are formed. Next, referring to FIG. 19, release film 62 is coated on carrier 60, and buffer layer 64 is formed on release film 62. Next, packages 54 are attached to buffer layer 64 through DAFs 52. In accordance with some embodiments of the present disclosure, no metal posts are formed on buffer layer 64.

Figure 20:
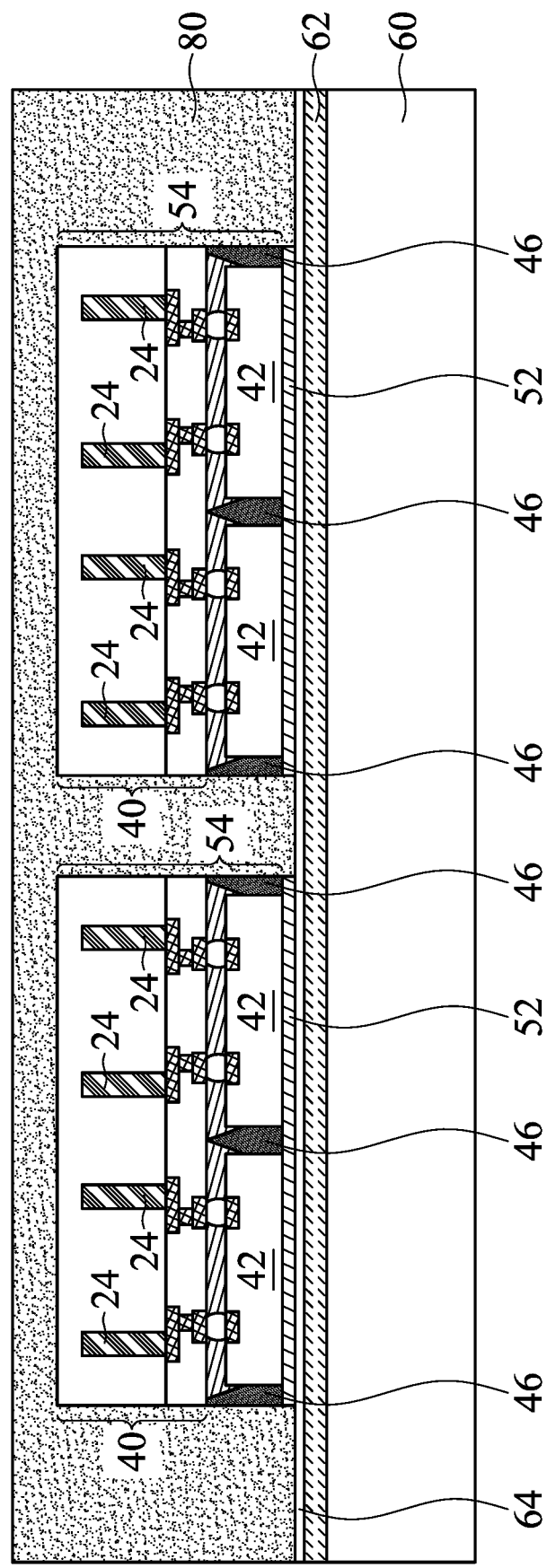
Figure 21:
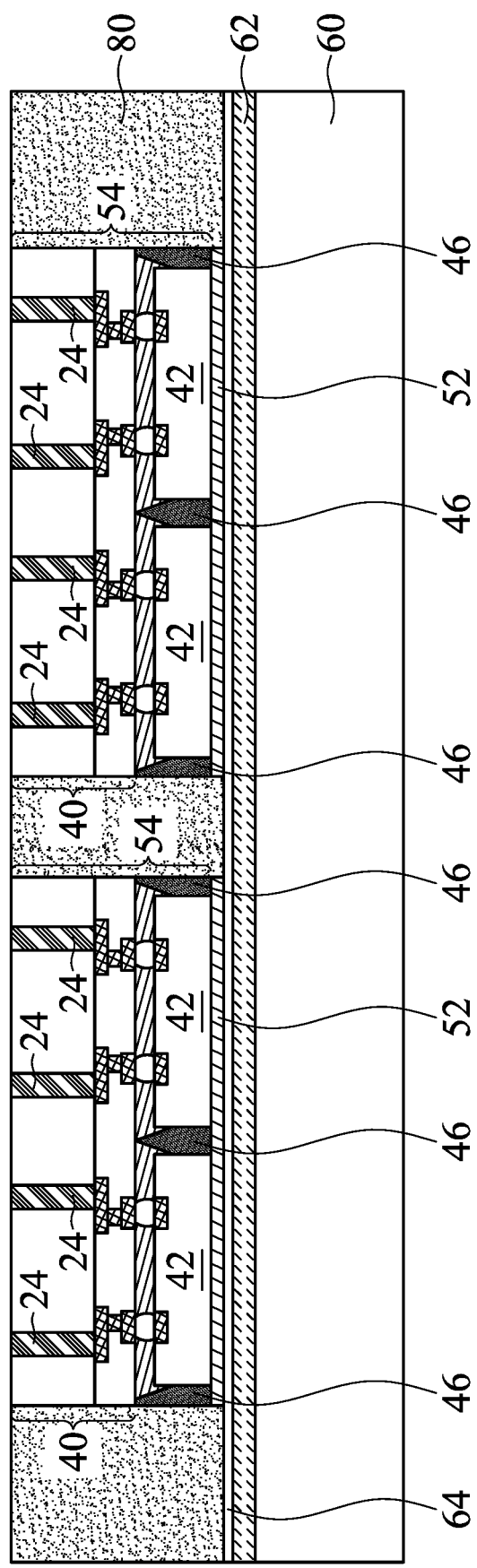

Referring to FIG. 20, packages 54 and DAFs 52 are encapsulated in encapsulant 80. In accordance with some embodiments of the present disclosure, packages 54 are fully encapsulated, with the top surface of encapsulant 80 being higher than the top surfaces of packages 54. Encapsulant 80 is then cured, followed by a planarization process to thin semiconductor substrate 22 in interposers 40. The resulting structure is shown in FIG. 21. After the planarization process, through-vias 24 (and isolation layers 26 as shown in FIG. 25) are revealed, with the top surfaces of through-vias 24 being coplanar with the top surface of encapsulant 80.

Figure 22:
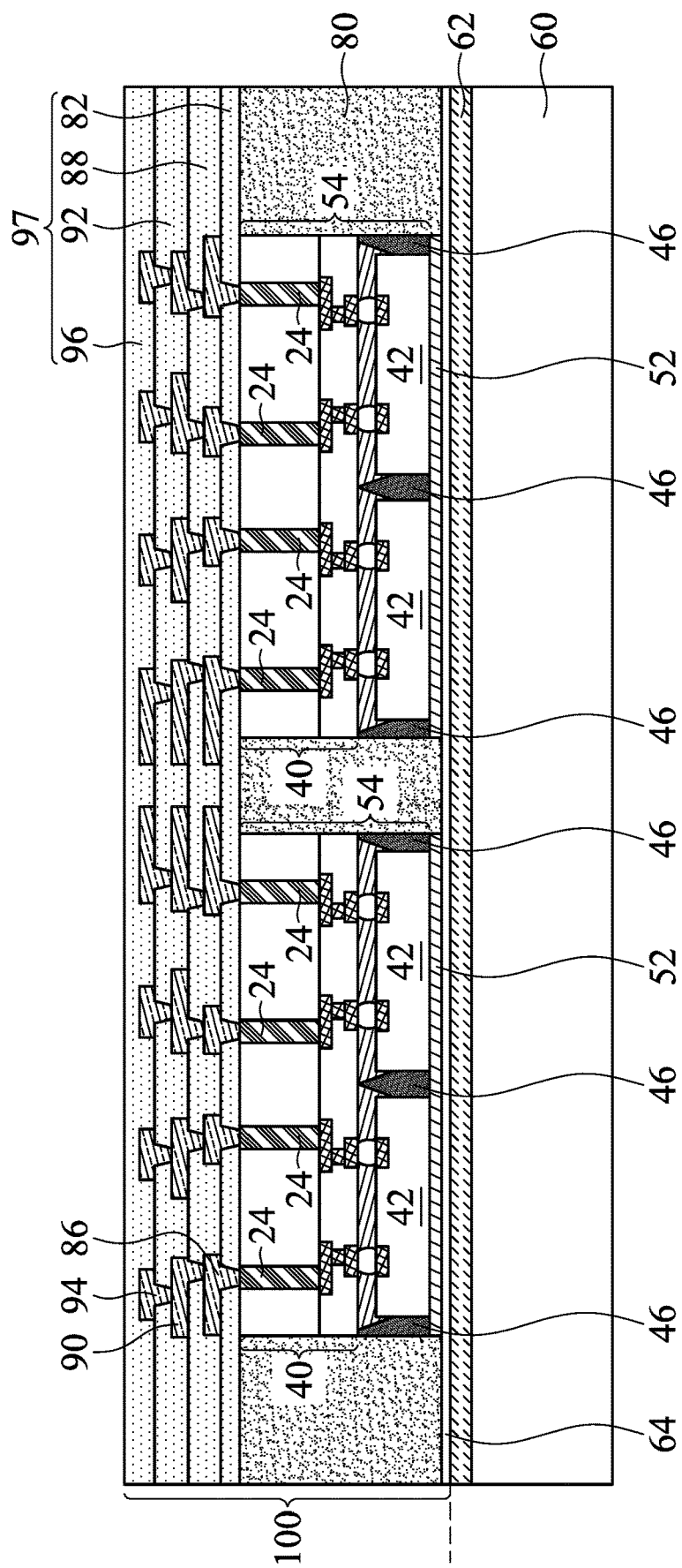
Figure 23:
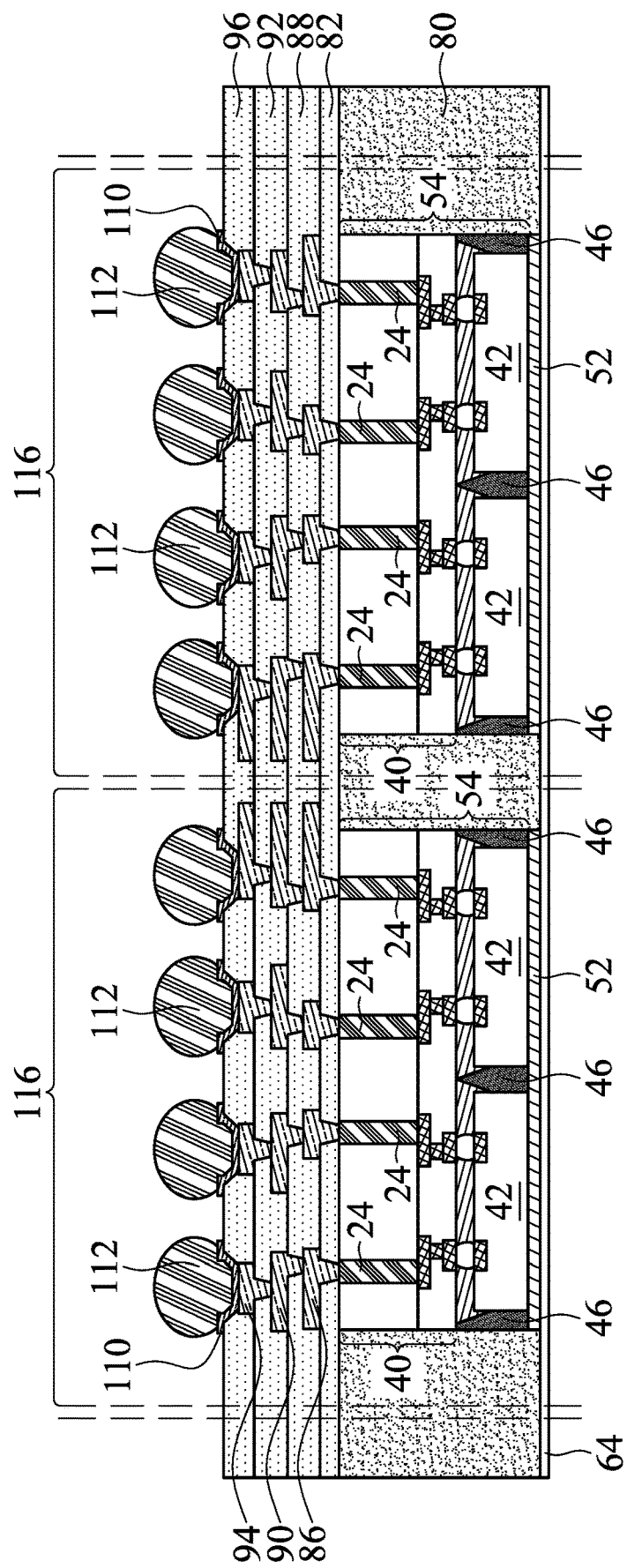

FIG. 22 illustrates the formation of redistribution structure (substrate 97) including, for example, dielectric layers 82, 88, 92, and 96 and RDLs 86, 90, and 94. After the formation of the redistribution structure, the resulting reconstructed wafer 100 is de-bonded from carrier 60. In subsequent processes, as shown in FIG. 23, UBMs 110 and electrical connectors 112 are formed. The reconstructed wafer 100 is then singulated, and the resulting package 116 is shown in FIG. 24.

In accordance with some embodiments, package 116 includes DAF 52, which is encapsulated in encapsulant 80. Buffer layer 64 may be attached to DAF 52 and encapsulant 80. In accordance with alternative embodiments, reconstructed wafer 100 may be polished to remove buffer layer 64 and DAF 52. FIG. 24 illustrates dashed line 120, wherein the bottom surface of package 116 may be at the level represented by line 120 when buffer layer 64 and DAF 52 are removed.

Figure 24:
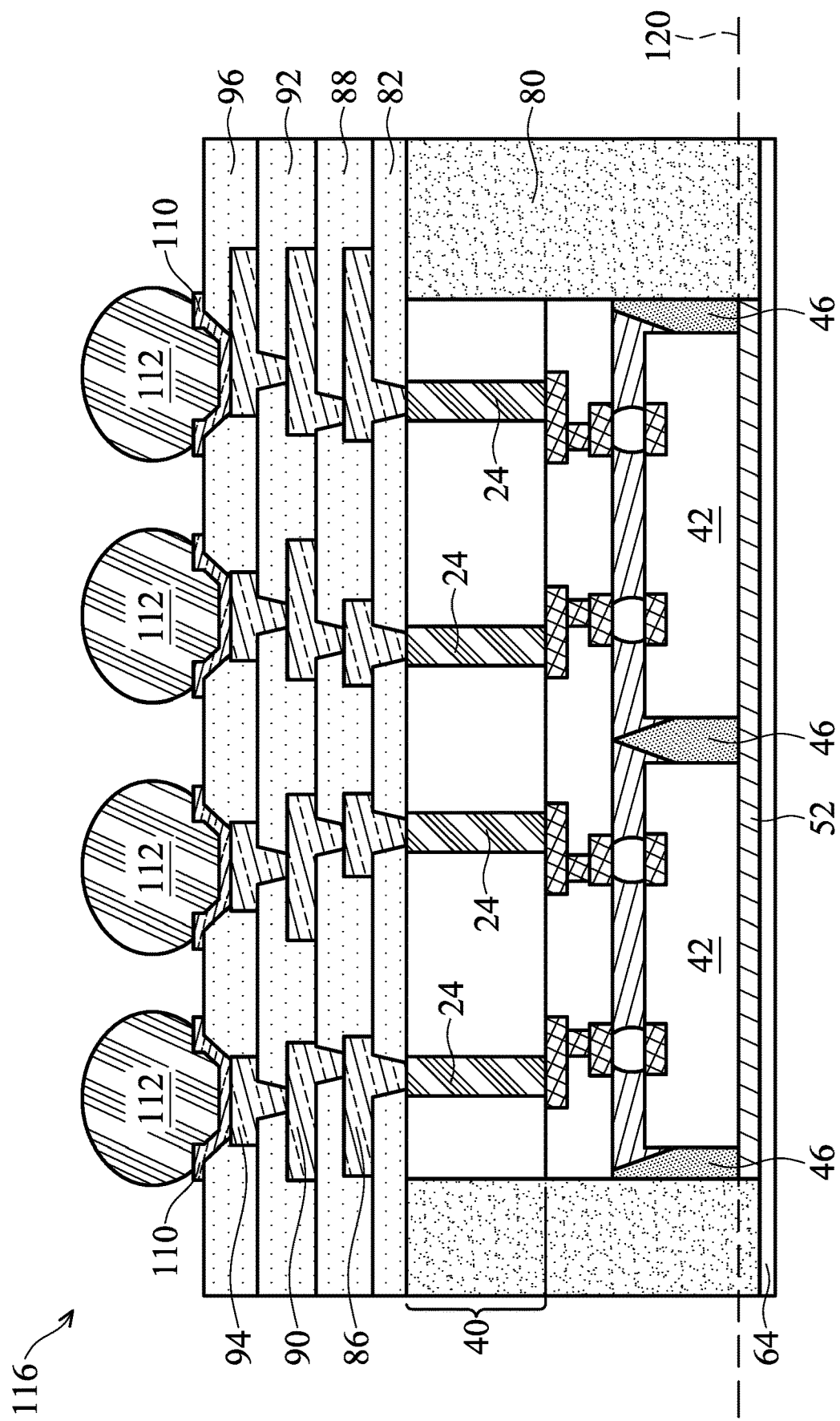

The packages 116 as shown in FIGS. 18 and 24 may be bonded to other packages. For example, electrical connectors 112 of packages 116 in FIGS. 18 and 24 may be bonded to another package component such as a printed circuit board, a frame, a package, or the like. An underfill (not shown) may also be disposed between the package 116 and the corresponding bonding package component to protect electrical connectors 112. A TIM and a heat sink may be attached, with the thermal interface material being between and contacting package 116 and the heat sink. The TIM may also extend into the openings 103 in FIG. 15.

FIG. 25 illustrates an amplified view of a portion 124 of the package 116 as shown in FIG. 18. Isolation liner 26, which encircles through-via 24, is illustrated. Isolation liner 26 may be formed of a dielectric material such as silicon oxide, silicon nitride, or the like. The top surfaces of isolation liner 26 and through-via 24 are coplanar, and are in contact with the bottom surface of via 86A in RDL 86. The top surface of isolation liner 26 may also contact the bottom surface of dielectric layer 82, depending on the relative sizes of through-via 24 and vias 86A. Furthermore, through-via 24 may be in contact with the seed layer of RDL 86, which seed layer may include, for example, titanium. FIG. 25 illustrates that encapsulant 80 include some partial filler particles 80B in contact with dielectric layer 82. Since these parts of filler particles 80B are polished in the planarization process shown in FIG. 10, these partial particles 80B may have planar top surfaces in contact with dielectric layer 82. As a comparison, the partial filler particles 80B in contact with dielectric layer 68 are full spherical particles that are not polished, and may have rounded bottom surfaces.

Furthermore, the encapsulant 46 in package 54 has left edge contacting encapsulant 80. Some partial filler particles 46B are at the interface between encapsulant 46 and encapsulant 80, and the partial filler particles 46B have flat surfaces contacting encapsulant 80 and DAF 52 in accordance with some embodiments.

In above-illustrated embodiments, some processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. Some CoW packages (including interposers) are large, for example, with sizes greater than about 70 mm×70 mm. In conventional packaging processes, the large CoW packages may include solder regions and possibly RDLs formed on the through-vias of the interposers. The CoW packages are bonded to pre-formed package substrates (which may be cored or core-less substrates) through the solder regions. Because the CoW packages are large, and further because there is a significant difference between the Coefficient of Thermal Expansion (CTE) of the interposer and the pre-formed package substrate, the packages suffer from issues such as poor solder joint, underfill void, poor planarity, and degrade reliability. In accordance with the embodiments of the present disclosure, Integrated Fan-Out (InFO) process is used to form substrates directly from CoW packages, and hence no solder regions are used to bond the CoW packages to substrates. Alternatively stated, the thinning of the interposer wafer is performed after, not before, sawing the interposer wafer. As a result, the reliability of the resulting packages is improved.

In accordance with some embodiments of the present disclosure, a method includes bonding a device die to an interposer, wherein the interposer comprises a through-via extending from a top surface of a semiconductor substrate of the interposer into an intermediate level between the top surface and a bottom surface of the semiconductor substrate; performing a first singulation process to saw the interposer and the device die into a first package; placing the first package over a carrier; encapsulating the first package in a first encapsulant; thinning the first encapsulant and the semiconductor substrate of the interposer, until the through-via is exposed; and forming redistribution lines, wherein a redistribution line in the redistribution lines is in contact with the through-via. In an embodiment, the method further includes forming a dielectric layer contacting the first package and the first encapsulant, wherein the redistribution lines extend into the dielectric layer, and wherein the through-via is encircled by an isolation layer, and the isolation layer is in contact with one of the dielectric layer and the redistribution line. In an embodiment, the method further includes, after the device die is bonded to the interposer, encapsulating the device die in a second encapsulant, wherein in the first singulation process, the second encapsulant is sawed-through. In an embodiment, the interposer is free from active devices. In an embodiment, before the semiconductor substrate of the interposer is thinned, a portion of the semiconductor substrate overlaps the through-via, and the portion of the semiconductor substrate is removed in the thinning. In an embodiment, the method further includes forming a metal post over the carrier, wherein the metal post is encapsulated in the first encapsulant, and wherein after the thinning the first encapsulant, the metal post is revealed. In an embodiment, the method further includes forming additional redistribution lines over the carrier, wherein the first package is placed over the additional redistribution lines; and bonding a passive device to the additional redistribution lines. In an embodiment, the method further includes performing a second singulation process to form a second package, wherein the first package and portions of the first encapsulant and portions of the redistribution lines are in the second package.

In accordance with some embodiments of the present disclosure, a method includes encapsulating a plurality of interposers in an encapsulant, with the plurality of interposers separated from each other by the encapsulant, wherein the plurality of interposers comprises through-vias extending into semiconductor substrates in the plurality of interposers; polishing the interposers to remove portions of the semiconductor substrates, wherein surfaces of the through-vias are revealed; forming a first dielectric layer over and contacting the semiconductor substrates and the through-vias of the plurality of interposers; forming redistribution lines extending into the first dielectric layer to contact the through-vias of the plurality of interposers; and sawing-through the encapsulant to separate the plurality of interposers into a plurality of packages. In an embodiment, in the sawing-through the encapsulant, the interposers are not sawed through. In an embodiment, the method further includes bonding a plurality of device dies, with each of the plurality of device dies bonded to one of the plurality of interposers, wherein the encapsulant comprises a first portion at a same level as the plurality of interposers, and a second portion at a same level as the plurality of device dies. In an embodiment, the method further includes, encapsulating the one of the plurality of device dies in an additional encapsulant; and sawing-through the additional encapsulant before the encapsulating the plurality of interposers in an encapsulant. In an embodiment, the first dielectric layer extends over the encapsulant, with a bottom surface of the first dielectric layer contacting a top surface of the encapsulant. In an embodiment, the interposers are free from active devices and passive devices therein.

In accordance with some embodiments of the present disclosure, an integrated circuit device includes a package, which includes a device die; an interposer bonded with the device die, wherein the interposer comprises: a semiconductor substrate; and a through-via penetrating through the semiconductor substrate; a first encapsulant encapsulating the package therein; a dielectric layer contacting the semiconductor substrate and the first encapsulant; and redistribution lines extending into the dielectric layer, wherein a redistribution line in the redistribution lines is in contact with the through-via. In an embodiment, the interposer further comprises an isolation liner encircling the through-via, wherein the isolation liner separates the through-via from the semiconductor substrate, and the isolation liner is in contact with one of the redistribution line and the dielectric layer. In an embodiment, the interposer is free from active devices therein. In an embodiment, the package further comprises a second encapsulant encapsulating the device die therein, wherein sidewalls of the second encapsulant are flush with corresponding sidewalls of the interposer. In an embodiment, the integrated circuit device further includes a metal post penetrating through the first encapsulant; and a passive device on an opposite side of the first encapsulant than the redistribution lines, wherein the passive device is electrically coupled to the metal post. In an embodiment, the integrated circuit device further includes an adhesive film contacting the package, wherein the adhesive film is encapsulated in the first encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
bonding a device die to an interposer, wherein the interposer comprises a through-via extending from a top surface of a semiconductor substrate of the interposer into an intermediate level between the top surface and a bottom surface of the semiconductor substrate;
performing a first singulation process to saw the interposer and the device die into a first package;
forming a first plurality of redistribution lines over a carrier;
placing the first package over the carrier and the first plurality of redistribution lines, wherein the first package is attached to the first plurality of redistribution lines through a die-attach film, and the device die is in physical contact with the die-attach film;
encapsulating the first package in a first encapsulant;
thinning the first encapsulant and the semiconductor substrate of the interposer, until the through-via is exposed;
forming a second plurality of redistribution lines, wherein a redistribution line in the second plurality of redistribution lines is in contact with the through-via; and bonding a passive device to the first plurality of redistribution lines.

2. The method of claim 1 further comprising forming a dielectric layer contacting the first package and the first encapsulant, wherein the second plurality of redistribution lines extend into the dielectric layer, and wherein the through-via is encircled by an isolation layer, and the isolation layer is in contact with one of the dielectric layer and the redistribution line.

3. The method of claim 1 further comprising, after the device die is bonded to the interposer, encapsulating the device die in a second encapsulant, wherein in the first singulation process, the second encapsulant is sawed-through.

4. The method of claim 1, wherein the thinning is performed with the first package being attached to the carrier.

5. The method of claim 1, wherein before the semiconductor substrate of the interposer is thinned, a portion of the semiconductor substrate overlaps the through-via, and the portion of the semiconductor substrate is removed in the thinning.

6. The method of claim 1 further comprising:
forming a metal post over the carrier, wherein the metal post is encapsulated in the first encapsulant, and wherein during the thinning the first encapsulant, both of the metal post and the through-via are polished.

7. The method of claim 1 further comprising, after the forming the second plurality of redistribution lines, performing a second singulation process to form a second package, wherein the first package and portions of the first encapsulant and portions of the second plurality of redistribution lines are in the second package.

8. A method comprising:
forming first redistribution lines over a carrier;
forming a dielectric layer over the first redistribution lines;
placing a plurality of packages over the dielectric layer, wherein the plurality of packages comprise a plurality of interposers;
forming a plurality of metal posts and a plurality of vias in a common plating process, wherein the plurality of metal posts are over the dielectric layer, and the plurality of vias extend into the dielectric layer to contact the first redistribution lines;
encapsulating the plurality of interposers and the plurality of metal posts in an encapsulant, with the plurality of interposers separated from each other by the encapsulant, wherein the plurality of interposers comprises through-vias extending into semiconductor substrates in the plurality of interposers;
polishing the interposers and the plurality of metal posts to remove portions of the semiconductor substrates, wherein surfaces of the through-vias and the plurality of metal posts are revealed;
forming a first dielectric layer over and contacting the semiconductor substrates and the through-vias of the plurality of interposers;
forming second redistribution lines extending into the first dielectric layer to contact the through-vias of the plurality of interposers and the plurality of metal posts; and
sawing-through the encapsulant to separate the plurality of interposers into an additional plurality of packages.

9. The method of claim 8 further comprising bonding a passive device to the first redistribution lines.

10. The method of claim 8 further comprising:
bonding a plurality of device dies, with each of the plurality of device dies bonded to one of the plurality of interposers, wherein the encapsulant comprises a first portion at a same level as the plurality of interposers, and a second portion at a same level as the plurality of device dies.

11. The method of claim 10 further comprising:
encapsulating the one of the plurality of device dies in an additional encapsulant; and
sawing-through the additional encapsulant.

12. The method of claim 8, wherein the first dielectric layer extends over the encapsulant, with a bottom surface of the first dielectric layer contacting a top surface of the encapsulant.

13. The method of claim 8, wherein the encapsulating is performed with the plurality of interposers and the plurality of metal posts being on the carrier, and wherein the polishing is performed when the plurality of interposers and the plurality of metal posts are on the carrier.

14. A method comprising:
bonding a plurality of device dies to a plurality of interposers in an interposer wafer, wherein the interposer wafer comprises a semiconductor substrate that continuously extends into the plurality of interposers;
with the plurality of device dies being bonded on the interposer wafer, performing a first singulation process on the interposer wafer to separate the plurality of interposers into a first plurality of packages, wherein the semiconductor substrate is cut-through by the first singulation process, and wherein each of the interposers comprises a piece of the semiconductor substrate and a through-via extended into the piece of the semiconductor substrate;
forming first redistribution lines over a carrier;
placing the first plurality of packages over the first redistribution lines;
encapsulating the first plurality of packages in an encapsulant;
with the first plurality of packages being attached to the carrier, thinning the encapsulant and the first plurality of packages to reveal the through-vias in the interposers of the first plurality of packages;
forming second redistribution lines in contact with the through-vias;
bonding a passive device to the first redistribution lines; and
performing a second singulation process to separate the encapsulant and the first plurality of packages into a second plurality of packages.

15. The method of claim 14, wherein at a time the first singulation process is performed, the through-via extends from a top surface of the respective piece of the semiconductor substrate into an intermediate level between the top surface and a bottom surface of the respective piece of the semiconductor substrate.

16. The method of claim 14 further comprising forming a dielectric layer contacting the first plurality of packages and the encapsulant, wherein the second redistribution lines extend into the dielectric layer.

17. The method of claim 16, wherein the through-via is encircled by an isolation layer, and the isolation layer is in contact with one of the dielectric layer and the second redistribution lines.

18. The method of claim 14, wherein no additional active devices are inserted into the interposers.

19. The method of claim 14, wherein when the encapsulant is thinned, the semiconductor substrate in the interposer wafer is thinned to reveal the through-via.

* * * * *